(12) United States Patent
Jo et al.

(10) Patent No.: US 12,279,421 B2
(45) Date of Patent: Apr. 15, 2025

(54) SEMICONDUCTOR DEVICE

(71) Applicant: Samsung Electronics Co., Ltd., Suwon-si (KR)

(72) Inventors: Sangyoun Jo, Suwon-si (KR); Kohji Kanamori, Seongnam-si (KR); Kwangyoung Jung, Hwaseong-si (KR); Jeehoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/190,253

(22) Filed: Mar. 27, 2023

(65) Prior Publication Data

US 2023/0262972 A1 Aug. 17, 2023

Related U.S. Application Data

(63) Continuation of application No. 17/155,225, filed on Jan. 22, 2021, now Pat. No. 11,616,070.

(30) Foreign Application Priority Data

Jun. 8, 2020 (KR) .......................... 10-2020-0069026

(51) Int. Cl.
*H10B 41/27* (2023.01)
*H01L 23/522* (2006.01)
(Continued)

(52) U.S. Cl.
CPC ......... *H10B 41/27* (2023.02); *H01L 23/5226* (2013.01); *H01L 23/528* (2013.01);
(Continued)

(58) Field of Classification Search
CPC .............. H01L 23/5226; H10L 23/528; H10L 21/76224; H10L 21/76877; H10L 27/0207;
(Continued)

(56) References Cited

U.S. PATENT DOCUMENTS 8,750,044 B2 6/2014 Choi
9,224,429 B2 12/2015 Park et al.
(Continued)

FOREIGN PATENT DOCUMENTS

KR 10-2007-0021758 A 2/2007
KR 10-2019-0091109 A 8/2019

*Primary Examiner* — Galina G Yushina
(74) *Attorney, Agent, or Firm* — Harness, Dickey & Pierce, P.L.C.

(57) ABSTRACT

A semiconductor device includes a substrate including a first plate portion and a second plate portion, a stack structure including interlayer insulating layers and gate electrodes alternately stacked on the substrate, a first block separation structure on the first plate portion and a second block separation structure on the first plate portion. Each of the first and second block separation structures includes first separation regions, a cell array separation structure including a second separation region connected to the first separation regions and channel structures penetrating the stack structure, wherein the stack structure includes first stack structures separated by the first separation regions of the first block separation structure and extending in the first direction, second stack structures separated by the first separation regions of the second block separation structure, and at least one third stack structure separated from the first and second stack structures by the cell array separation structure.

18 Claims, 34 Drawing Sheets

(51) Int. Cl.
*H01L 23/528* (2006.01)
*H10B 41/10* (2023.01)
*H10B 41/40* (2023.01)
*H10B 43/10* (2023.01)
*H10B 43/27* (2023.01)
*H10B 43/40* (2023.01)

(52) U.S. Cl.
CPC ............. *H10B 41/10* (2023.02); *H10B 41/40* (2023.02); *H10B 43/10* (2023.02); *H10B 43/27* (2023.02); *H10B 43/40* (2023.02)

(58) Field of Classification Search
CPC ........ H10B 41/41; H10B 43/35; H10B 41/27; H10B 41/10; H10B 41/40; H10B 43/10; H10B 43/27; H10B 43/50; H10B 41/35
See application file for complete search history.

(56) References Cited

U.S. PATENT DOCUMENTS

| | | |
|---|---|---|
| 9,754,670 B1 | 9/2017 | Choi |
| 9,812,176 B2 | 11/2017 | Chen |
| 10,388,663 B2 | 8/2019 | Oh et al. |
| 2017/0256558 A1 | 9/2017 | Zhang et al. |
| 2019/0164991 A1 | 5/2019 | Lim et al. |
| 2019/0237477 A1* | 8/2019 | Baek ...................... H10B 43/10 |
| 2019/0371406 A1 | 12/2019 | Yang et al. |
| 2019/0371811 A1* | 12/2019 | Oike ....................... H10B 41/23 |
| 2020/0013787 A1 | 1/2020 | Lee et al. |
| 2020/0027892 A1* | 1/2020 | Zhu ......................... H10B 43/40 |
| 2020/0066742 A1* | 2/2020 | Kim ........................ H10B 43/50 |
| 2021/0074711 A1 | 3/2021 | Suzuki et al. |

\* cited by examiner

SEMICONDUCTOR DEVICE

CROSS-REFERENCE TO RELATED APPLICATION(S)

This application is a continuation of U.S. patent application Ser. No. 17/155,225 filed on Jan. 22, 2021, which claims benefit of priority to Korean Patent Application No. 10-2020-0069026 filed on Jun. 8, 2020 in the Korean Intellectual Property Office, the disclosure of each of which is incorporated herein by reference in its entirety.

BACKGROUND

Some example embodiments of inventive concepts relate to a semiconductor device.

A semiconductor device has been desired/required to have a reduced volume and/or to process high capacity data. Accordingly, it may be desirable/necessary to increase integration density of a semiconductor device. As one method for improving integration density of a semiconductor device, a semiconductor device having a vertical transistor structure, instead of a general planar transistor structure, has been suggested.

SUMMARY

Some example embodiments of inventive concepts provides a semiconductor device having improved integration density and/or electrical properties.

According to some example embodiments of inventive concepts, a semiconductor device includes a substrate including a first plate portion and a second plate portion spaced apart from each other, a stack structure including interlayer insulating layers and gate electrodes alternately stacked on the substrate, a first block separation structure on the first plate portion and a second block separation structure on the second plate portion, each of the first and second block separation structures including first separation regions extending in a first direction, a cell array separation structure including a second separation region connected to the first separation regions and extending in a second direction that is perpendicular to the first direction; and channel structures penetrating the stack structure. The stack structure includes first stack structures separated in the second direction by the first separation regions of the first block separation structure and extending in the first direction, second stack structures separated in the second direction by the first separation regions of the second block separation structure and extending in the first direction, and at least one third stack structure separated from the first and second stack structures in the first direction by the cell array separation structure and extending in the second direction.

According to some example embodiments of inventive concepts, a semiconductor device includes a substrate including a first plate portion and a second plate portion spaced apart from each other, first stack structures and second stack structures spaced apart from each other in a first direction parallel to an upper surface of the substrate, wherein the first stack structures include a first staircase region and a first cell array region on the first plate portion, and the second stack structures include a second staircase region and a second cell array region on the second plate portion, channel structures penetrating the first and second stack structures on the first and second cell array regions, a cell array separation structure extending in a second direction perpendicular to the first direction between the first stack structures and the second stack structures, a first block separation structure between the first stack structures and extending in the first direction, and a second block separation structure between the second stack structures and extending in the first direction. The first and second cell array regions are between the first staircase region and the second staircase region.

According to some example embodiments of inventive concepts, a semiconductor device includes a peripheral circuit region including a base substrate and circuit devices on the base substrate, a semiconductor layer on the peripheral circuit region, a stack structure including interlayer insulating layers and gate electrodes alternately stacked on the semiconductor layer, a cell array separation structure penetrating the stack structure, and a block separation structure extending from the cell array separation structure. A portion of the gate electrodes extend by different lengths in a direction in which the block separation structure extends from the cell array separation structure, the block separation structure extends in a first direction, the cell array separation structure extends in a second direction perpendicular to the first direction, and the first direction and the second direction are parallel to an upper surface of the semiconductor layer.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION OF EXAMPLE EMBODIMENTS

Hereinafter, some example embodiments of inventive concepts will be described as follows with reference to the accompanying drawings.

Figure 1A:
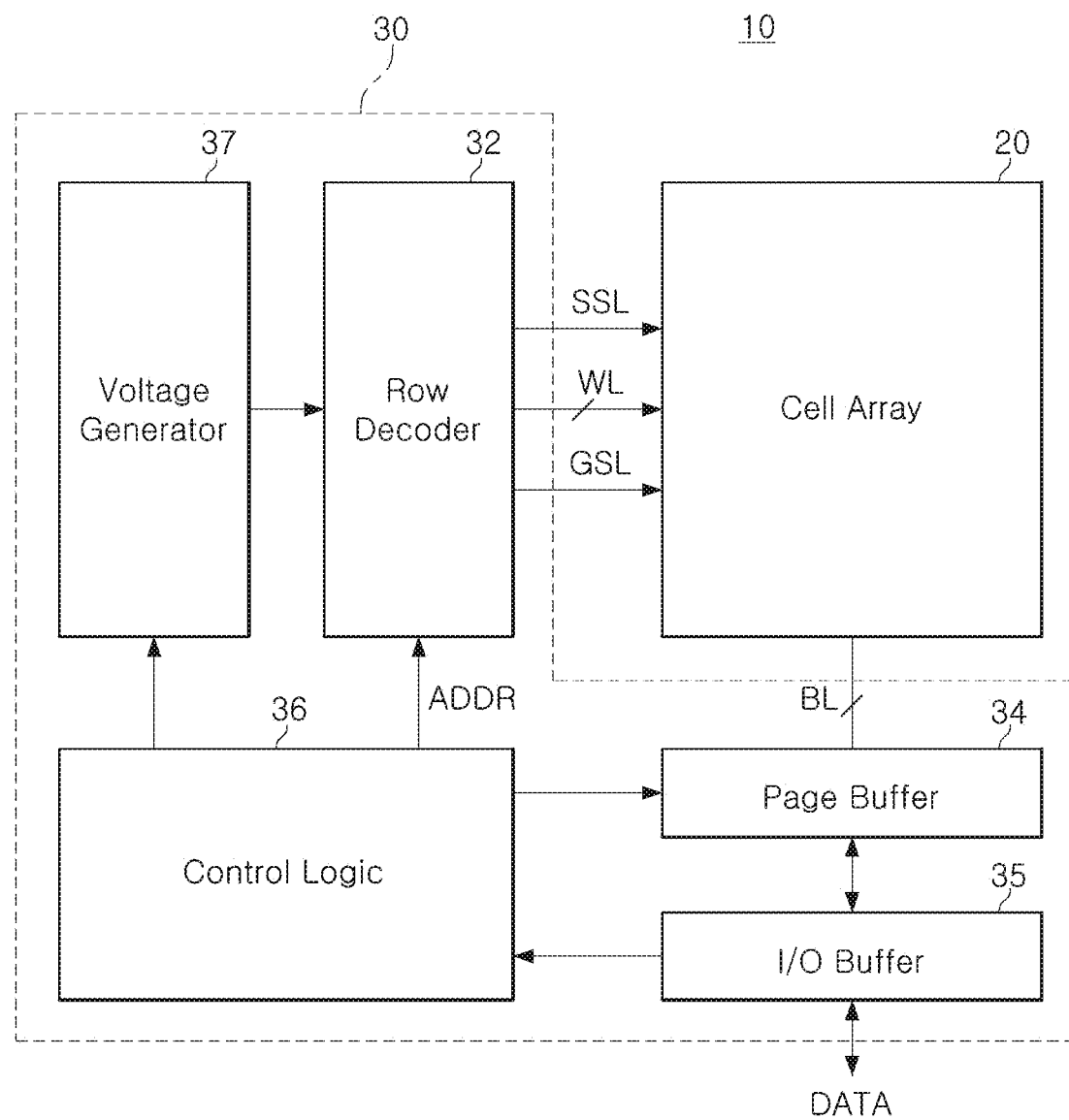
FIG. 1A is a schematic block diagram illustrating a semiconductor device according to some example embodiments of inventive concepts.

FIG. 1A is a schematic block diagram illustrating a semiconductor device according to some example embodiments.

Referring to FIG. 1A, a semiconductor device 10 may include a memory cell array 20 and a peripheral circuit 30. The peripheral circuit 30 may include a row decoder 32, a page buffer 34, an input and output buffer 35, control logic 36, and/or a voltage generator 37.

The memory cell array 20 may include a plurality of memory blocks, and each of the memory blocks may include a plurality of memory cells. The plurality of memory cells may be connected to the row decoder 32 through a string select line SSL, word lines WL, and a ground select line GSL, and may be connected to the page buffer 34 through bit lines BL. In some example embodiments, the plurality of memory cells arranged in the same row may be connected to the same word line WL, and the plurality of memory cells arranged in the same column may be connected to the same bit line BL.

The row decoder 32 may, by decoding an input address ADDR that may be supplied from the outside, generate and transfer driving signals of the word line WL. The row decoder 32 may provide a word line voltage generated from the voltage generator 37 to each of a selected word line WL and non-selected word lines WL in response to control of the control logic 36.

The page buffer 34 may be connected to the memory cell array 20 through the bit lines BL and may read data stored in the memory cells. The page buffer 34 may temporarily store data to be stored in the memory cell or may sense data stored in the memory cells. The page buffer 34 may include a column decoder and a sense amplifier. The column decoder may selectively activate the bit lines BL, and the sense amplifier may sense and amplify a voltage of a bit line BL selected by the column decoder and may read data stored in a selected memory cell during a read operation.

The input and output buffer 35 may receive data DATA and may transfer the data to the page buffer 34 during a program operation, and during a read operation, the input and output buffer 35 may output the data DATA received from the page buffer 34 to an external device/entity. The input and output buffer 35 may transfer an input address or an input command to the control logic 36.

The control logic 36 may control operations of the row decoder 32 and the page buffer 34. The control logic 36 may receive a control signal and an external voltage transferred from an external device/entity, and may operate according to the control signal. The control logic 36 may control read, write, and/or erase operations in response to the control signals.

The voltage generator 37 may generate voltages required for/used during an internal operation, such as a program voltage, a read voltage, an erase voltage, and/or the like, for example, using an external voltage. A voltage generated by the voltage generator 37 may be transferred to the memory cell array 20 through the row decoder 32.

Figure 1B:
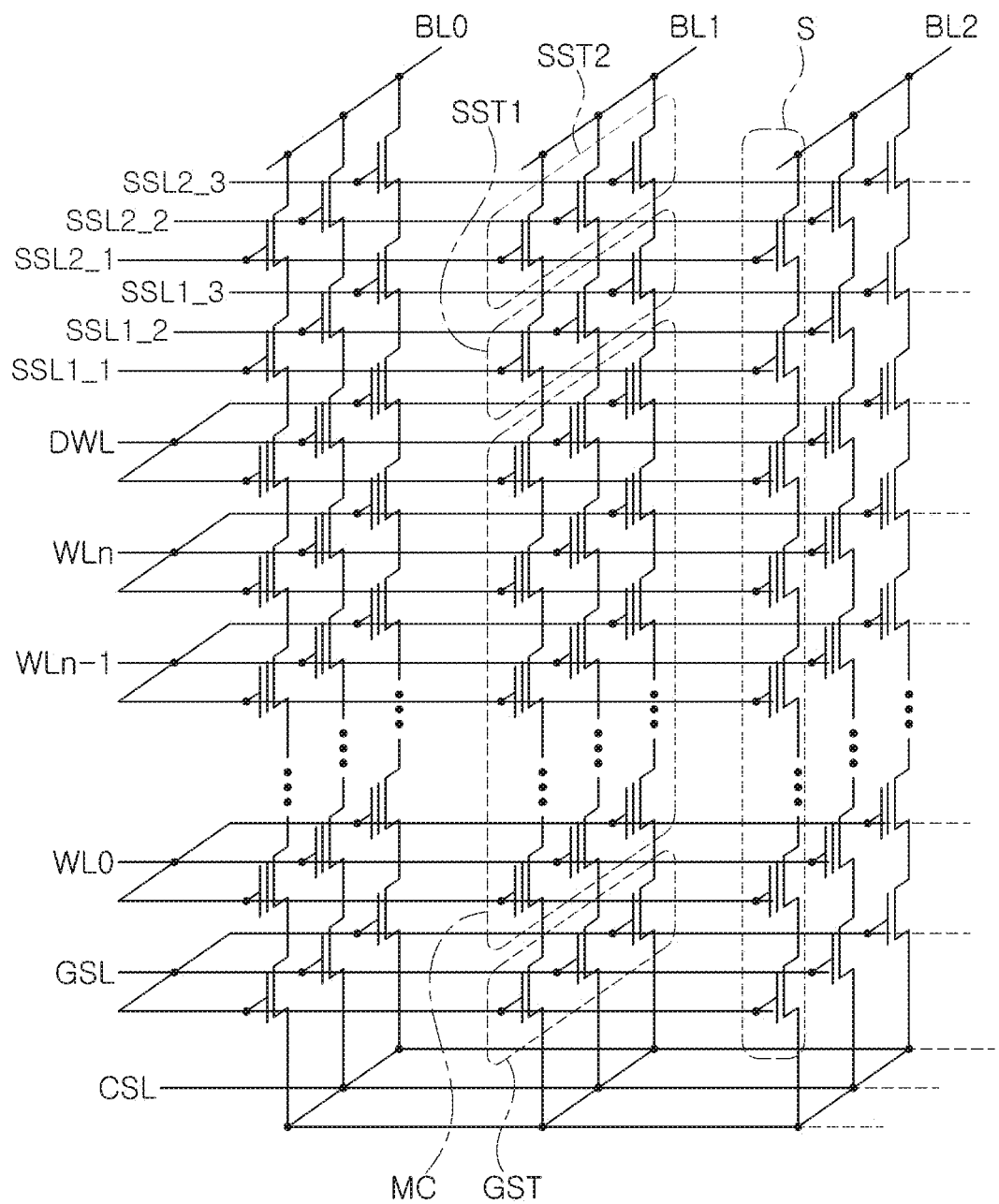
FIG. 1B is an equivalent circuit diagram illustrating a cell array of a semiconductor device according to some example embodiments of inventive concepts.

FIG. 1B is an equivalent circuit diagram illustrating a cell array of a semiconductor device according to some example embodiments.

Referring to FIG. 1B, a memory cell array 20 may include a plurality of memory cell strings S including memory cells MC connected to each other in series, a ground select transistor GST and a string select transistor SST1 and SST2 which may be connected to both ends of the memory cells MC in series. The plurality of memory cell strings S may be connected to bit lines BL0-BL2 in parallel, respectively. The plurality of memory cell strings S may be connected in common to a common source line CSL. For example, the plurality of memory cell strings S may be disposed between the plurality of bit lines BL0-BL2 and a single common source line CSL. In some example embodiments, a plurality of the common source lines CSL may be arranged two-dimensionally.

The memory cells MC connected to each other in series may be controlled by word lines WL0-WLn for selecting the memory cells MC. Each of the memory cells MC may include a data storage element. Gate electrodes of the memory cells MC disposed in the same or substantially the same distance from the common source line CSL may be connected to one of the word lines WL0-WLn in common and may be in an equipotential state; however, example embodiments are not limited thereto. For example, even when gate electrodes of the memory cells MC are disposed in the same or substantially the same distance from the common source line CSL, the gate electrodes disposed in different rows or columns may be controlled independently.

The ground select transistor GST may be controlled by a ground select line GSL and may be connected to the common source line CSL. The string select transistors SST1 and SST2 may be controlled by string select lines SSL1_1, SSL1_2, SSL1_3, SSL2_1, SSL2_2, and SSL2_3 and may be connected to the bit lines BL0-BL2. FIG. 2 illustrates a structure in which a single ground select transistor GST and two string select transistors SST1 and SST2 are connected to each of the plurality of memory cells MC connected to each other in series, but some example embodiments thereof is not limited thereto. A single string select transistors SST1 and SST2 or a plurality of ground select transistors GST may be connected to the plurality of memory cells MC. One or more dummy lines DWL or a buffer line may be disposed between an uppermost word line WLn of the word lines WL0-WLn and the string select lines SSL1_1, SSL1_2, SSL1_3, SSL2_1, SSL2_2, and SSL2_3. In some example embodiments, one or more dummy lines DWL may also be disposed between a lowermost word line WL0 and the ground select lines GSL. The dummy word lines DWL may not be electrically connected to other components of the cell array 20.

When a signal is applied to the string select transistors SST1 and SST2 through the string select lines SSL1_1, SSL1_2, SSL1_3, SSL2_1, SSL2_2, and SSL2_3, a signal applied through the bit lines BL0-BL2 may be transferred to the memory cells MC connected to each other in series such that a data read and write operation may be performed. Also, by applying an erase voltage through a substrate, an erase operation for erasing data written in the memory cells MC may be performed. In some example embodiments, the memory cell array 20 may include at least one dummy memory cell string electrically separated from the bit lines BL0-BL2.

Figure 1C:
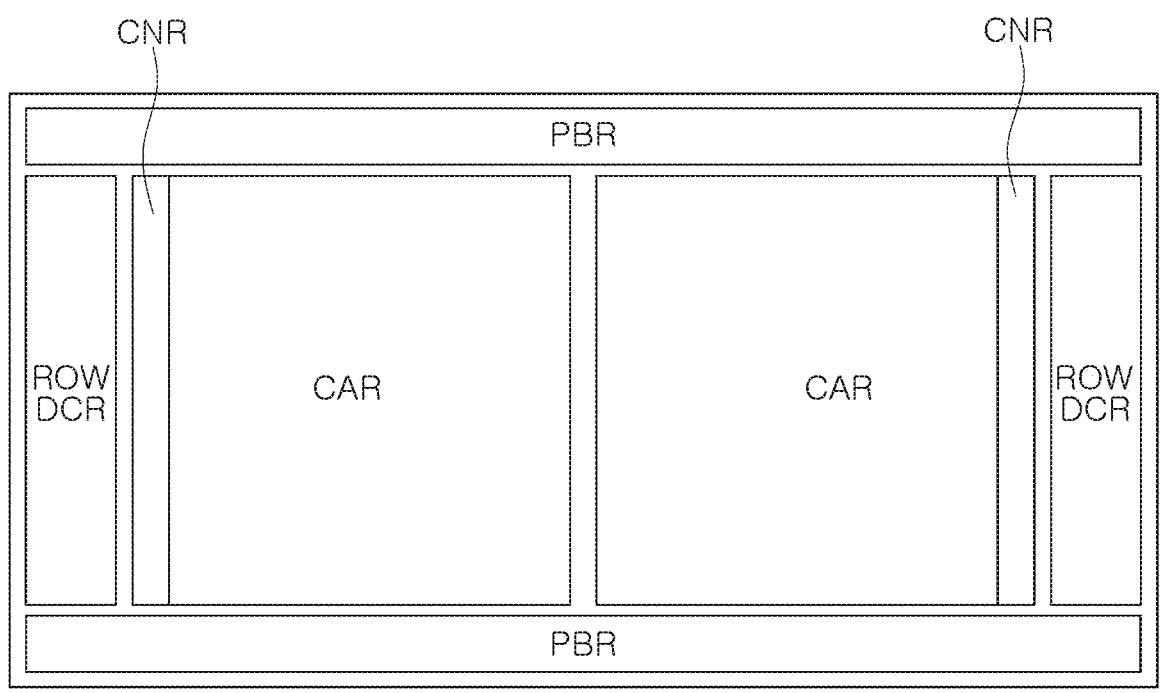
FIG. 1C is a schematic diagram illustrating a configuration of a semiconductor device according to some example embodiments of inventive concepts.

FIG. 1C is a schematic diagram illustrating a configuration of a semiconductor device according to some example embodiments.

Referring to FIG. 1C, a semiconductor device may include a cell array region CAR and a peripheral circuit region. The peripheral circuit region may include row decoder regions ROW DCR, a page buffer region PBR, a column decoder region COL DCR, and/or a control circuit region (not illustrated). In some example embodiments, a connection region CNR may be disposed between the cell array region CAR and the row decoder regions ROW DCR.

A memory cell array including a plurality of memory cells may be disposed in the cell array region CAR. In some example embodiments, the memory cell array may include memory cells arranged three-dimensionally and a plurality of word lines and bit lines electrically connected to the memory cells.

A row decoder for selecting word lines of the memory cell array may be disposed in the row decoder region ROW DCR, and a wiring structure including contact plugs and wirings for electrically connecting the memory cell array to the row decoder may be disposed in the connection region CNR. The row decoder may select one of the word lines of the memory cell array according to address information, e.g. address information provide from an external device/entity. The row decoder may provide a word line voltage to each of a selected word line and non-selected word lines in response to a control signal of a control circuit. The row decoder region ROW DCR may only be disposed in one side of the cell array region CAR.

A page buffer for reading data stored in the memory cells may be disposed in a page buffer region PBR. The page buffer may temporarily store data to be stored in the memory cells and/or may sense data stored in the memory cells according to an operation mode. The page buffer may operate as a write driver during a program operation, and may operate as a sense amplifier during a read operation.

A column decoder connected to bit lines of the memory cell array may be disposed in the column decoder region COL DCR. The column decoder may provide a data transfer path between the page buffer and an external device (e.g., a memory controller).

Figure 2A:
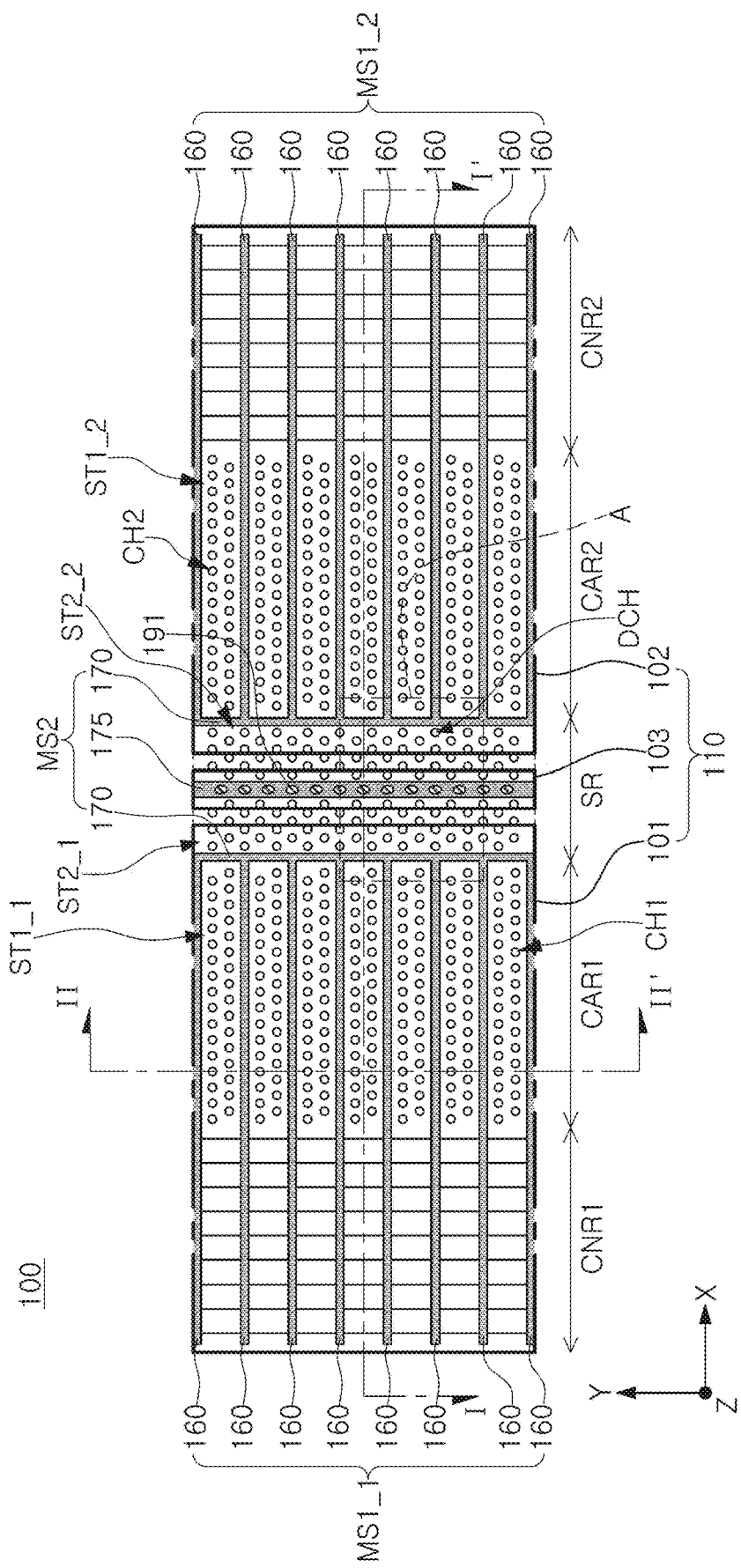
FIG. 2A is a schematic plan diagram illustrating a semiconductor device according to some example embodiments of inventive concepts.
Figure 2B:
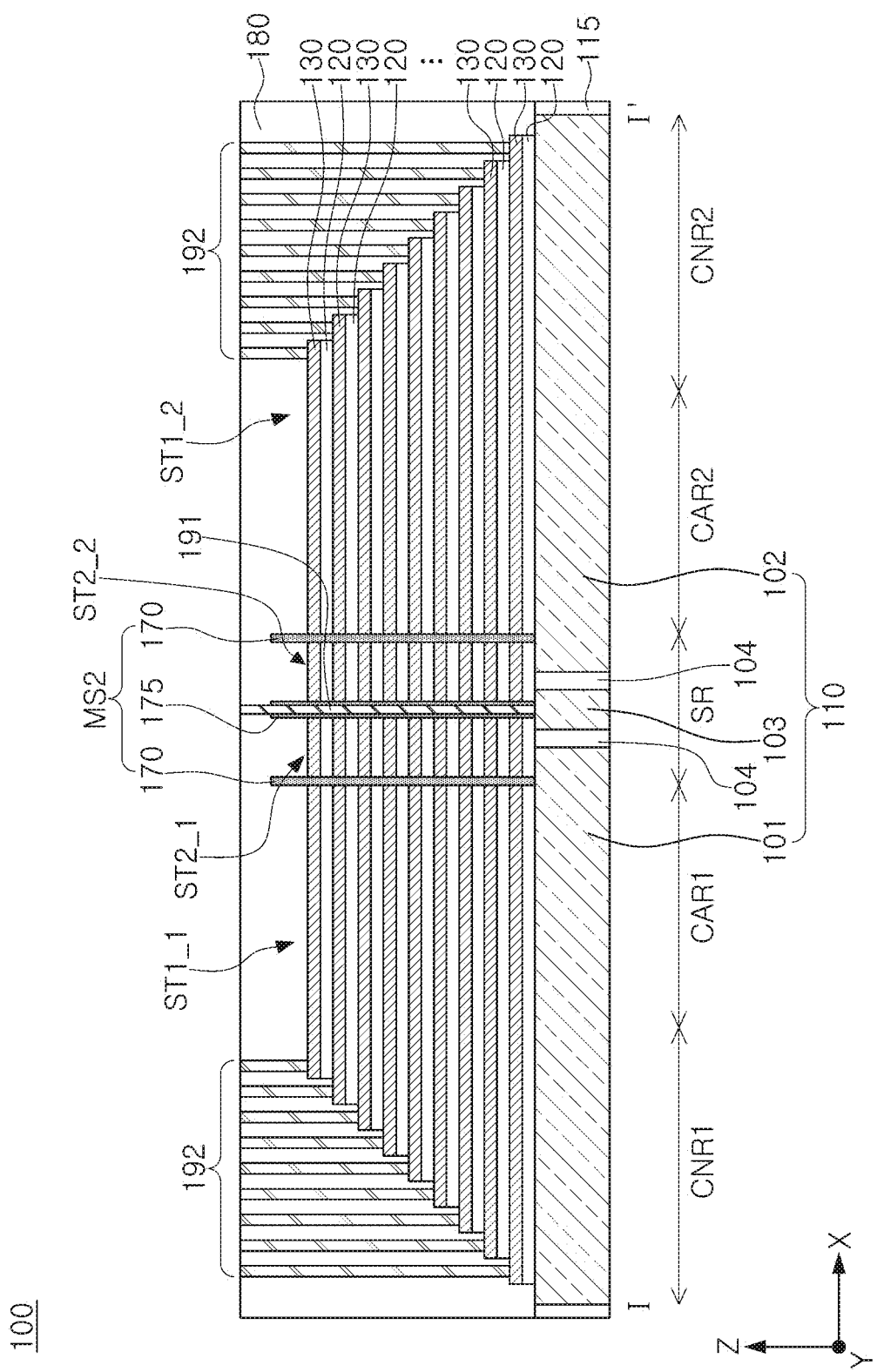
FIGS. 2B and 2C are cross-sectional diagrams along lines I-I' and II-II' in FIG. 2A.
Figure 2C:
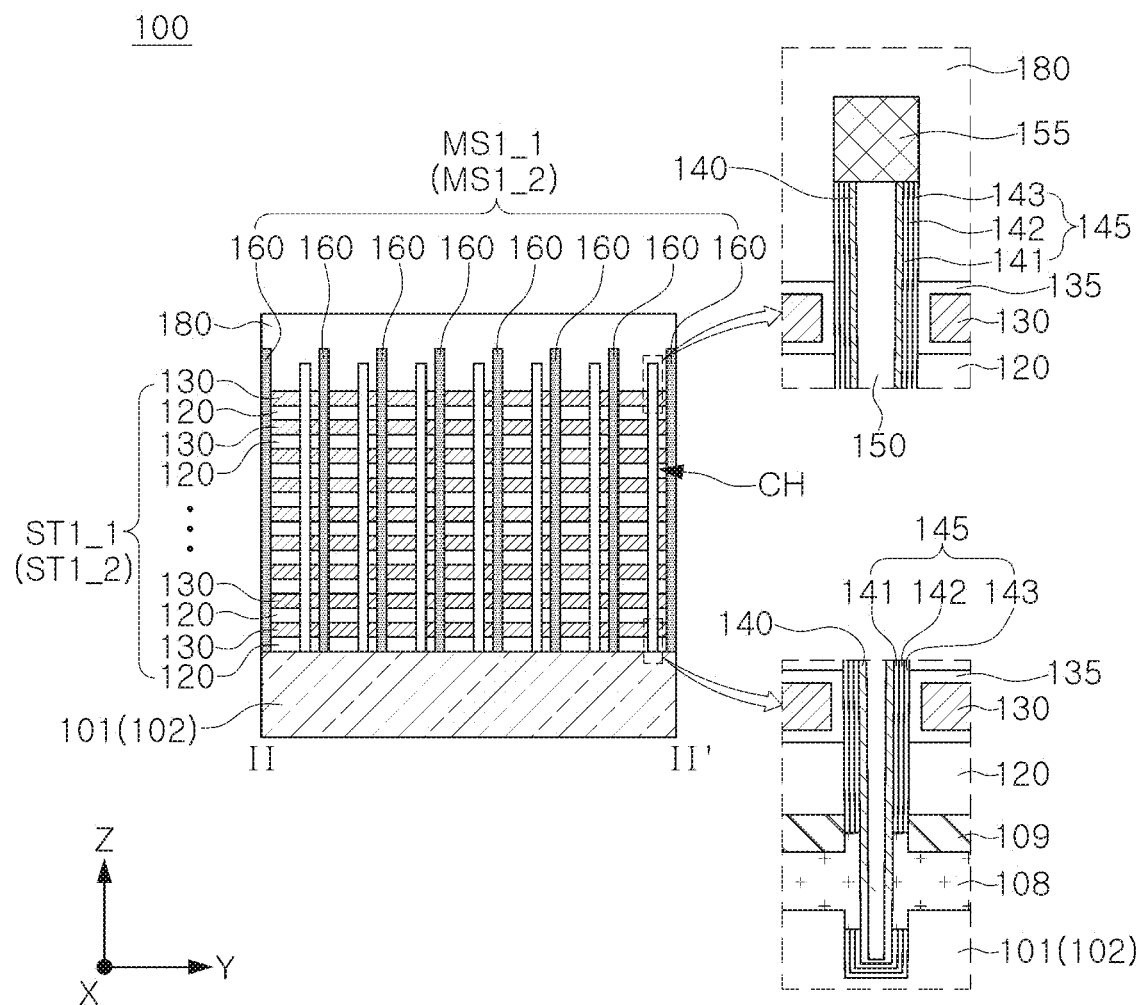

FIG. 2A is a schematic plan diagram illustrating a semiconductor device according to some example embodiments. FIGS. 2B and 2C are cross-sectional diagrams taken along lines I-I' and II-II', respectively, in FIG. 2A.

Referring to FIGS. 2A to 2C, a semiconductor device 100 in some example embodiments may include a first substrate 110 including plate portions 101, 102, and 103 separated from one another by a lower separation region 104, a stack structure ST1_1, ST1_2, ST2_1, and ST2_2 including interlayer insulating layers 120 and gate electrodes 130, channel structures CH including a channel layer 140, first and second block separation structures MS1_1 and MS1_2 including first separation regions 160, respectively, and a cell array separation structure MS2 including second separation regions 170 and a third separation region 175. The semiconductor device 100 may further include dummy channel structures DCH, an external insulating layer 115, a capping insulating layer 180, a ground contact structure 191, and a gate contact structure 192. The dummy channel structures DCH may not electrically connect to other components of the semiconductor device 100.

The first substrate 110 may have an upper surface extending in a first direction X and a second direction Y. In some example embodiments, the first substrate 110 may include a undoped or lightly doped single-crystal silicon layer or a doped polysilicon layer. For example, the first substrate 110 may include a polysilicon layer having N-type conductivity. In some example embodiments, the first substrate 110 may include a polysilicon layer having N-type conductivity and a polysilicon layer having P-type conductivity. The external insulating layer 115 may be disposed on an external side of the first substrate 110.

The first substrate 110 may include first and second plate portions 101 and 102 and a third plate portion 103 disposed between the first and second plate portions 101 and 102. The first to third plate portions 101, 102, and 103 may be spaced apart from each other in the first direction X by the lower separation region 104 extending in the second direction Y. The lower separation region 104 may penetrate the first substrate 110 in a third direction Z. The third direction Z may be perpendicular to the first and second directions X and Y. The lower separation region 104 may include an insulating material, such as silicon oxide, silicon nitride, or a combination thereof.

The third plate portion 103 may be in a state in which a ground voltage has been applied thereto through the ground contact structure 191, and when the first and second plate portions 101 and 102 work as common source lines, the third plate portion 103 may prevent, or reduce the likelihood/ impact from a coupling phenomenon between the first and second plate portions 101 and 102. The first to third plate portions 101, 102, and 103 may be insulated from one another. The first to third plate portions 101, 102, and 103 may be referred to as semiconductor layers.

The stack structure ST1_1, ST1_2, ST2_1, and ST2_2 may be disposed on the first substrate 110. The stack structure ST1_1, ST1_2, ST2_1, and ST2_2 may include interlayer insulating layers 120 and gate electrodes 130 alternately stacked on the first substrate 110.

The stack structure ST1_1, ST1_2, ST2_1, and ST2_2 may include first and second stack structures ST1_1 and ST1_2 separated in the second direction Y by the first and second block separation structures MS1_1 and MS1_2, and third stack structures ST2_1 and ST2_2 separated from the first and second stack structures ST1_1 and ST1_2 in the first direction X by the cell array separation structure MS2 and extending in the second direction Y. The first stack structure ST1_1 and the second stack structure ST1_2 may be electrically separated in the first direction X by the cell array separation structure MS2. The third stack structure ST2_1 and ST2_2 may be separated in the first direction X by the third separation region 175.

The first stack structure ST1_1 may be disposed on the first plate portion 101. The first stack structure ST1_1 may have a first cell array region CAR1 and a first staircase region CNR1. The first stack structure ST1_1 may have a staircase structure as the gate electrodes 130 extend by different lengths in the first staircase region CNR1. The first stack structure ST1_1 may not have a staircase structure in the first cell array region CAR1 adjacent to a separation region SR. For example, the first stack structure ST1_1 may not have a staircase structure in a region adjacent to the cell array separation structure MS2.

The second stack structure ST1_2 may be disposed on the second plate portion 102. The second stack structure ST1_2 may have a second cell array region CAR2 and a second staircase region CNR2. The second stack structure ST1_2 may have a staircase structure as the gate electrodes 130 extend by different lengths in the second staircase region CNR2. The second stack structure ST1_2 may not have a staircase structure in the second cell array region CAR2 adjacent to a separation region SR. For example, the second stack structure ST1_2 may not have a staircase structure in a region adjacent to the cell array separation structure MS2.

The third stack structure ST2_1 and ST2_2 may be disposed on the third plate portion 103. The third stack structure ST2_1 and ST2_2 may be partially disposed on the lower separation region 104. The third stack structure ST2_1 and ST2_2 may also be partially disposed on the first and second plate portions 101 and 102. The third stack structure ST2_1 and ST2_2 may form the separation region SR along with the cell array separation structure MS2. The third stack structure ST2_1 and ST2_2 may not have a staircase structure in the separation region SR.

The gate electrodes 130 may be stacked on the first substrate 110 and may be spaced apart from each other vertically. The number of layers of the gate electrodes 130 is not limited to the example illustrated in FIGS. 2A to 2C, and may be more than, or less than, the number of layers illustrated in FIGS. 2A to 2C.

The gate electrodes 130 may extend to the first staircase region CNR1 in the first direction X in the first cell array region CAR1 of the first stack structure ST1_1, and/or may extend to the second staircase region CNR2 in the first direction X in the second cell array region CAR2 of the second stack structure ST1_2. The gate electrodes 130 may be electrically connected to the gate contact structures 192 by end portions of the gate electrodes 130 exposed upwardly in the first staircase region CNR1 and the second staircase region CNR2. Accordingly, the gate electrodes 130 may be connected to a wiring structure disposed in an upper portion.

The gate electrodes 130 may extend in the second direction Y in the separation region SR of the third stack structure ST2_1 and ST2_2 as illustrated in FIGS. 2A and 2B. The gate electrodes 130 of the third stack structure ST2_1 and ST2_2 may be spaced apart from the gate electrodes 130 of the first and second stack structures ST1_1 and ST1_2. Side surfaces of the gate electrodes 130 in contact with the cell array separation structure MS2 may be aligned in the third direction Z. The gate electrodes 130 of the third stack structure ST2_1 and ST2_2 may be configured as dummy gate electrodes which do not have a function or substantial function in the semiconductor device 100.

The gate electrodes 130 may be separated by a specific (or, alternatively, predetermined) unit/amount in the second direction Y by the first block separation structure MS1 extending in the first direction X as illustrated in FIGS. 2A and 2B. The gate electrodes 130 between a pair of the first block separation structures MS1 may form a single memory block, but an example of the memory block is not limited thereto.

The gate electrodes 130 may include a metal material, such as tungsten (W), for example. In some example embodiments, the gate electrodes 130 may include at least one of metal nitride, polycrystalline silicon, or metal silicide material.

The gate electrodes 130 may include a gate conductive layer and a diffusion barrier 135 surrounding the gate conductive layer. The diffusion barrier 135 may include, for example, tungsten nitride (WN), tantalum nitride (TaN), titanium nitride (TiN), or a combination thereof. In some example embodiments, the diffusion barrier 135 may not be provided.

The interlayer insulating layers 120 may be disposed between the gate electrodes 130. The interlayer insulating layers 120 may also be disposed to be spaced apart from each other in the third direction Z and to extend in the first direction X, similarly to the gate electrodes 130. The interlayer insulating layers 120 may extend by different lengths in the first direction X and may form a staircase structure along with the gate electrodes 130. The interlayer insulating layers 120 may include an insulating material such as silicon oxide and/or silicon nitride.

The channel structures CH may include first and second channel structures CH1 and CH2 forming rows and columns and spaced apart from each other in the first and second cell array regions CAR1 and CAR2, respectively. Each of the first and second channel structures CH1 and CH2 may be disposed to form a lattice pattern, e.g. a triangular lattice pattern such as a regular triangular lattice pattern or a rectangular lattice pattern such as a square lattice pattern, or may be disposed in zigzag form in one direction. The first and second channel structures CH1 and CH2 may penetrate the gate electrodes 130, may extend in the third direction Z, and may be in contact with the first and second plate portions 101 and 102, respectively. The channel structures CH may have a columnar shape, and may have an inclined side surface having a width decreasing towards the first substrate 110 depending on an aspect ratio. The arrangement position, the number, and the shape of the first and second channel structures CH1 and CH2 may be varied.

Referring to FIG. 2C, the channel layer 140, a gate dielectric layer 145, and a channel insulating layer 150 may be disposed in each of the channel structures CH. The channel layer 140 in the channel structures CH may be formed to have an annular shape surrounding the channel insulating layer 150 disposed therein, but in some example embodiments, the channel layer 140 may have a columnar shape such as a cylindrical shape or a prism shape without the channel insulating layer 150. The channel layer 140 may include a semiconductor material such as polycrystalline silicon and/or monocrystalline silicon, and the semiconductor material may be an undoped material or a material including p-type impurities such as boron or n-type impurities such as phosphorus and/or arsenic.

In the channel structures CH, channel pads 155 may be disposed above the channel layer 140. The channel pads 155 may be disposed to cover an upper surface of the channel insulating layer 150 and to be electrically connected to the channel layer 140. The channel pads 155 may include, for example, doped polycrystalline silicon.

The gate dielectric layer 145 may be disposed between the gate electrodes 130 and the channel layer 140. The gate dielectric layer 145 may include a tunneling layer 141, a data storage layer 142, and a blocking layer 143, stacked in order from the channel layer 140. The tunneling layer 141 may tunnel an electric charge to the data storage layer 142, and may include, for example, at least one of silicon oxide, silicon nitride, silicon oxynitride. The data storage layer 142 may be configured as an electric charge trapping layer and/or a floating gate conductive layer. The blocking layer 143 may include at least one of silicon oxide, silicon nitride, silicon oxynitride, high-k dielectric materials.

The semiconductor device 100 may further include first and second horizontal conductive layers 108 and 109 disposed between the first substrate 110 and a lowermost interlayer insulating layer 120 on an upper surface of the first substrate 110. At least a portion of the first and second horizontal conductive layers 108 and 109 may function as a portion of a common source line of the semiconductor device 100, and may also function as a common source line along with the first and second plate portions 101 and 102 of the first substrate 110. As illustrated in FIG. 2C, the first horizontal conductive layer 108 may be connected, e.g. directly connected to the channel layer 140 on a circumference of the channel layer 140. The first and second horizontal conductive layers 108 and 109 may include a semiconductor material, and may include, for example, polycrystalline silicon such as doped polysilicon. In this case, at least the first horizontal conductive layer 108 may be configured as a doped layer, and the second horizontal conductive layer 109 may be configured as a doped layer and/or a layer including impurities diffused from the first horizontal conductive layer 108.

The dummy channel structures DCH may form rows and columns in the separation regions SR and may be spaced apart from each other. The dummy channel structures DCH may penetrate the gate electrodes 130 of the third stack structures ST2_1 and ST2_2, may extend in the third direction Z, and may be in contact with the third plate portion 103. The dummy channel structures DCH may have a structure the same as or similar to a structure of the channel structures CH, and may not have any function or substantial function in the semiconductor device 100. Although not illustrated in the diagram, the dummy channel structures DCH may be disposed to form rows and columns in the first staircase region CNR1 and the second staircase region CNR2 and to penetrate the gate electrodes 130. The arrangement position, the number, and the shape of the dummy channel structures DCH may be varied.

The first block separation structures MS1_1 may penetrate the first stack structure ST1_1 in the third direction Z. The first block separation structures MS1_1 may separate the first stack structure ST1_1 in the second direction Y. The first block separation structures MS1_1 may extend in the first direction X to the first staircase region CNR1 in the first cell array region CAR1 of the first stack structure ST1_1. The first block separation structures MS1_1 may include the first separation regions 160 spaced apart from each other in the second direction Y.

The second block separation structures MS1_2 may penetrate the second stack structure ST1_2 in the third direction Z. The second block separation structures MS1_2 may separate the second stack structure ST1_2 in the second direction Y. The second block separation structures MS1_2 may extend in the first direction X to the second staircase region CNR2 in the second cell array region CAR2 of the second stack structure ST1_2. The second block separation structures MS1_2 may include the first separation regions 160 spaced apart from each other in the second direction Y.

The first separation region 160 may be configured as a through separation region penetrating the gate electrodes 130 stacked on the first substrate 110 in the third direction Z and in contact with the first substrate 110. The first separation region 160 may penetrate the gate electrodes 130. The first separation region 160 may extend from one side of the second separation region 170 in the first direction X. The first separation region 160 may be disposed to be recessed into an upper portion of the first substrate 110 or may be disposed on the first substrate 110 to be in contact with the upper surface of the first substrate 110.

In some example embodiments, the first and second block separation structures MS1_1 and MS1_2 may further include at least one or more auxiliary separation regions extending in the first direction X between the first separation regions 160 and spaced apart from each other linearly in the first direction X.

The cell array separation structure MS2 may be disposed to extend in the second direction Y in the separation region SR. The cell array separation structure MS2 may extend linearly. The cell array separation structure MS2 may not have a staircase structure on each of side surfaces of the first and second stack structures ST1_1 and ST1_2. Each of the side surfaces of the first and second stack structures ST1_1 and ST1_2 may be in contact with the second separation region 170. The cell array separation structure MS2 may separate the first stack structure ST1_1 and the second stack structure ST1_2 in the first direction X. The cell array separation structure MS2 may include the plurality of second separation regions 170 connected to ends of the first separation regions 160 of the first and second block separation structures MS1_1 and MS1_2 on the first and second plate portions 101 and 102, and the third separation region 175 spaced apart from the second separation regions 170 in the first direction X on the third plate portion 103. The ends of the first separation regions 160 may refer to a conceptual ends disposed on a plane the same as a surface on which the first and second stack structures ST1_1 and ST1_2 are in contact with the second separation regions 170. The ends of the first separation regions 160 may be connected to the second separation regions 170. A lower end of the cell array separation structure MS2 may not be in contact with the lower separation region 104.

The second separation regions 170 may be configured as through separation regions penetrating the gate electrodes 130 in the third direction Z and in contact with/direct contact with the first and second plate portions 101 and 102 of the first substrate 110. The second separation regions 170 may separate the first stack structure ST1_1 and the third stack structure ST2_2 from each other in the first direction X, or may separate the second stack structure ST1_2 and the third stack structure ST2_1 and ST2_2 from each other in the first direction X. The second separation region 170 may cover side surfaces of the third stack structure ST2_1 and ST2_2 along with the third separation region 175. The second separation regions 170 may overlap the first and second plate portions 101 and 102 in the third direction Z. The second separation regions 170 may not overlap the lower separation region 104 in the third direction Z. A lower end of the second separation regions 170 may not be in contact with/in direct contact with the lower separation region 104.

The plurality of second separation regions 170 may be referred to as a first separation region and a second separation region, respectively. In this case, the first block separation structures MS1_1 may extend from the first separation region and may allow the first stack structures ST1_1 to be spaced apart from each other. The second block separation structures MS1_2 may extend from the second separation region and may allow the second stack structures ST1_2 to be spaced apart from each other.

In some example embodiments, the second separation regions 170 may be connected to the first separation regions 160. The first separation regions 160 and the second separation regions 170 connected to each other may be formed in a same process step and be integrated with each other.

In some example embodiments, a structure and/or a shape of a cross-sectional surface of the second separation regions 170 in the first direction X may be the same or substantially the same as a structure and/or a shape of a cross-sectional surface of the first separation region 160 in the second direction Y.

The third separation region 175 may be disposed between the third stack structure ST2_1 and ST2_2 on the third plate portion 103. The third separation region 175 may be disposed between the second separation regions 170. The third separation region 175 may be configured as a through separation region penetrating the gate electrodes 130 in the third direction Z and in contact/direct contact with the third plate portion 103 of the first substrate 110. The third separation region 175 may overlap the third plate portion 103 in the third direction Z. The third separation region 175 may not overlap the lower separation region 104 in the third direction Z. A lower end of the third separation region 175 may not be in contact/direct contact with the lower separation region 104. The ground contact structures 191 may be disposed in the third separation region 175.

In some example embodiments, a structure and/or a shape of a cross-sectional surface of the third separation region 175 in the first direction X may be the same or substantially the same as a structure and/or a shape of a cross-sectional surface of the first separation region 160 in the second direction Y, and/or a structure and/or a shape of a cross-sectional surface of the second separation region 170 in the first direction X.

In some example embodiments, a width of the second separation region 170 in the first direction may be the same or substantially the same as or less or greater than a width of the first separation region 160 in the second direction Y. A width of the third separation region 175 in the first X may be the same or substantially the same as or less or greater than a width of the first separation regions 160 in the second direction Y.

The first separation regions 160 of the first and second block separation structures MS1_1 and MS1_2, the second separation regions 170 and the third separation region 175 of the cell array separation structure MS2 may include the same material, and may include an insulating material such as silicon oxide, silicon nitride, or a combination thereof, for example. The first separation regions 160, the second separation regions 170, and the third separation region 175 may be formed in the same process, but example embodiments thereof is not limited thereto.

According to some example embodiments, as the cell array separation structure MS2 does not have a staircase structure, and the first stack structure ST1_1 and the second stack structure ST1_2 do not have a staircase structure in a region adjacent to the cell array separation structure MS2, the first stack structure ST1_1 and the second stack structure ST1_2 may be separated from each other while reducing the waste of the separation region SR. Accordingly, the semiconductor device having improve integration density may be provided.

The capping insulating layer 180 may be disposed to cover the first substrate 110 and the stack structure ST1_1, ST1_2, ST2_1, and ST2_2. The capping insulating layer 180 may include a plurality of insulating layers. The capping insulating layer 180 may include an insulating material such as silicon oxide and/or silicon nitride.

The ground contact structure 191 may be disposed on the third plate portion 103 in the separation region SR. The ground contact structure 191 may penetrate the capping insulating layer 180 and the third separation region 175 in the third direction Z and may be electrically connected to the third plate portion 103. The ground contact structure 191 may be partially recessed into the third plate portion 103 and may be connected to the third plate portion 103. The ground contact structure 191 may be connected to wiring lines in an upper portion. The ground contact structure 191 may apply a ground voltage, or a voltage less than a ground voltage, to the third plate portion 103. A plurality of the ground contact structures 191 may be disposed in the second direction Y.

The ground contact structure 191 may have a columnar shape, but some example embodiments thereof is not limited thereto. The ground contact structure 191 may have a cross-sectional surface having a shape such as a circular shape, an oval shape, a polygonal shape, or a linear shape, but example embodiments thereof is not limited thereto. The arrangement position, the number, and/or the shape of the ground contact structure 191 may be varied.

The ground contact structure 191 may include a conductive material, and may include, for example, at least one of tungsten (W), copper (Cu), aluminum (Al), or the like. The ground contact structure 191 may include a conductive plug and a barrier material layer.

The gate contact structures 192 may partially penetrate the capping insulating layer 180 from an upper portion on the first and second staircase regions CNR1 and CNR2 and may be electrically connected to the gate electrodes 130 having staircase-shaped stepped portions. The gate contact structures 192 may be recessed into the gate electrodes 130 and may be connected to the gate electrodes 130. The gate contact structures 192 may be connected to wiring lines on an upper portion. The gate contact structures 192 may electrically connect the gate electrodes 130 to circuit devices of the peripheral circuit region.

The gate contact structures 192 may include a conductive material, and may include, for example, at least one of tungsten (W), copper (Cu), aluminum (Al), or the like. The gate contact structures 192 may include a conductive plug and a barrier metal layer.

Figure 3A:
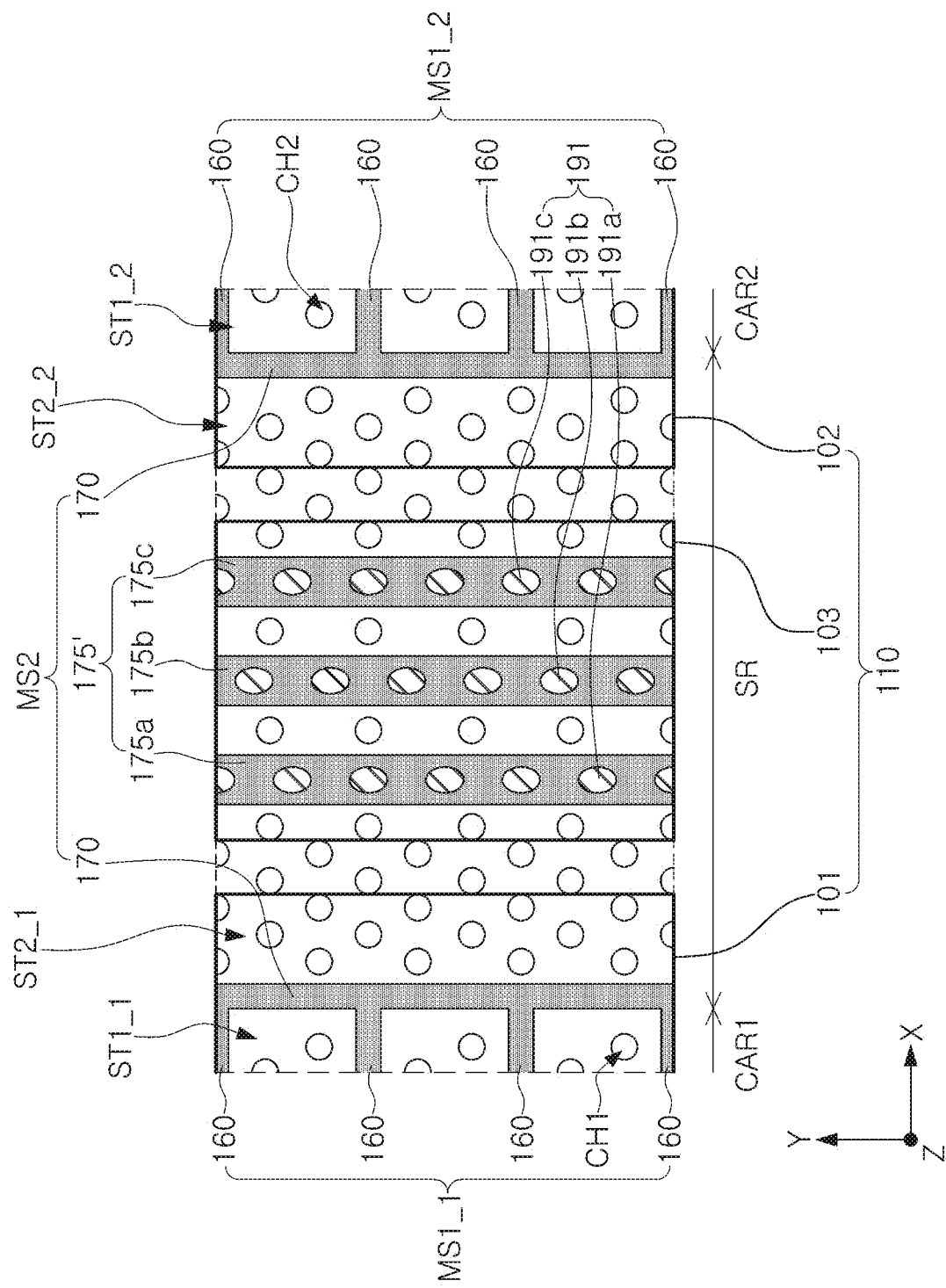
FIGS. 3A to 3C are schematic enlarged plan diagrams illustrating a semiconductor device according to some example embodiments of inventive concepts.
Figure 3B:
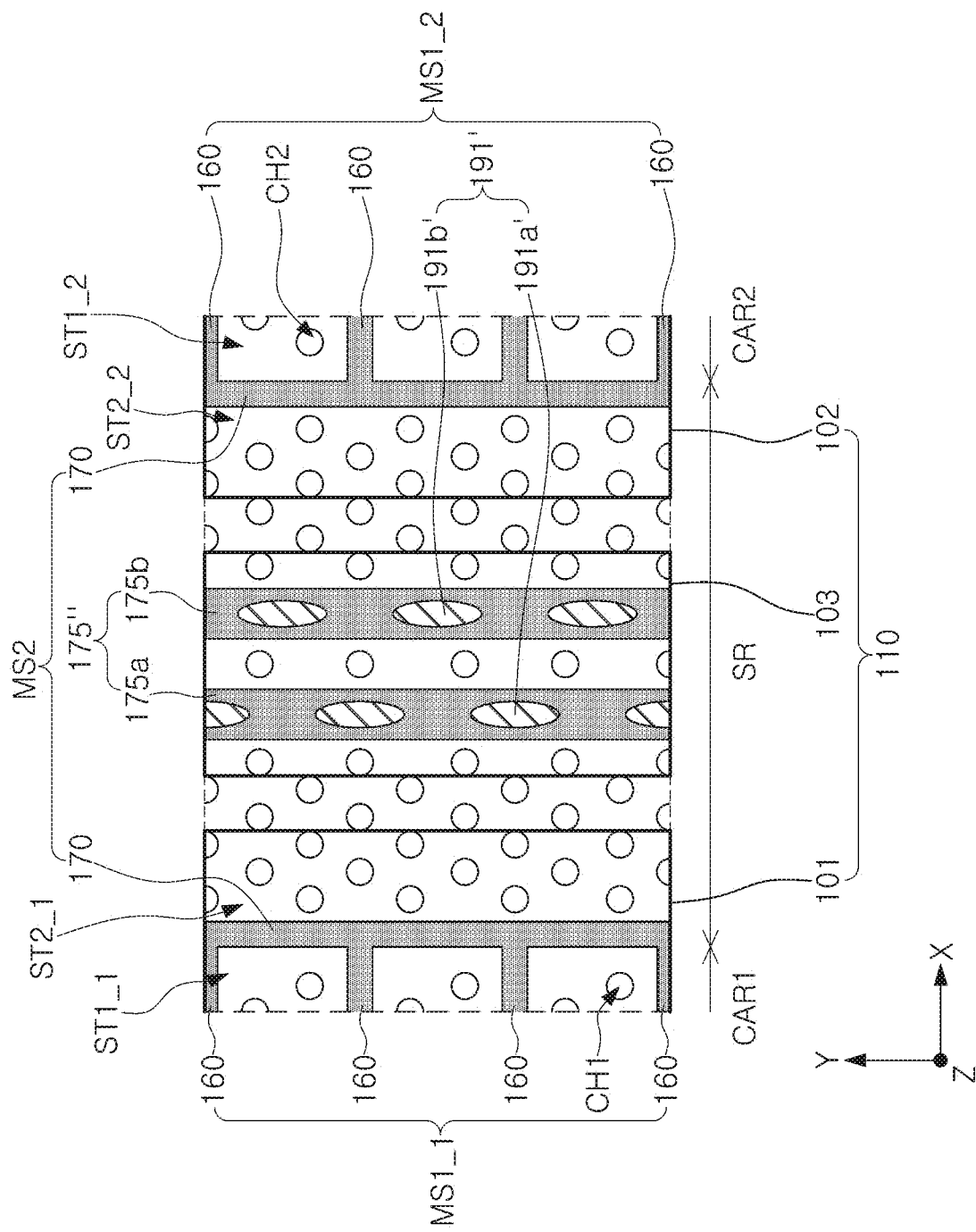
Figure 3C:
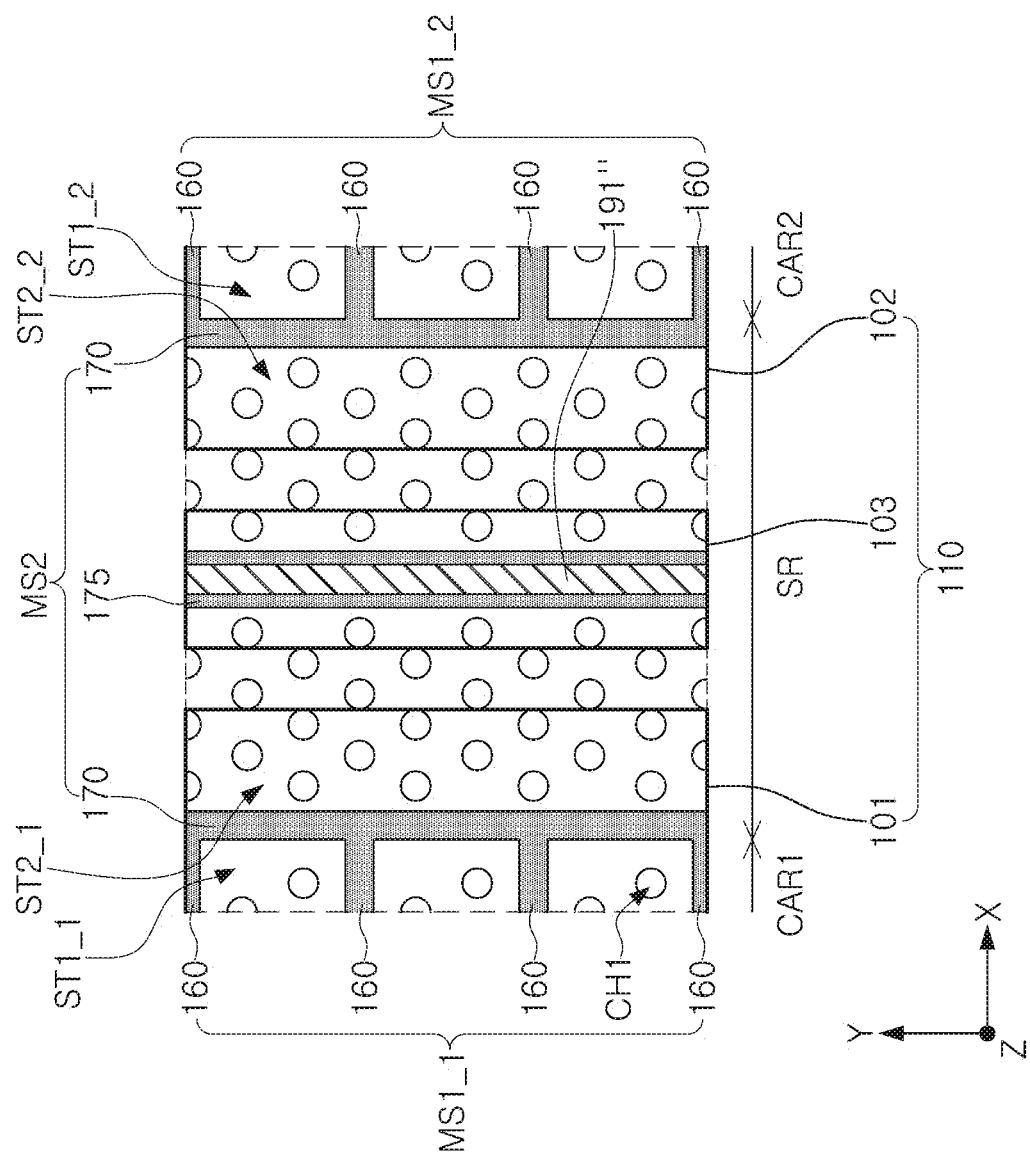

FIGS. 3A to 3C are schematic enlarged plan diagrams illustrating a semiconductor device according to some example embodiments, illustrating a region corresponding to "A" in FIG. 2A.

Referring to FIG. 3A, the arrangement and the number of each of a third separation region 175' and a ground contact structure 191 may be different from those of the aforementioned example embodiments.

The third separation region 175' may include a first central separation region 175a, a second central separation region 175b, and a third central separation region 175c, spaced apart from one another in the first direction X and extending in the second direction Y. The first to third central separation regions 175a, 175b, and 175c may be disposed on a third plate portion 103 in a separation region SR. The first to third central separation regions 175a, 175b, and 175c may penetrate a third stack structures ST2_1 and ST2_2 in the third direction Z.

The ground contact structure 191 may include a first ground contact structure 191a disposed to penetrate the first central separation region 175a, a second ground contact structure 191b disposed to penetrate the second central separation region 175b, and a third ground contact structure 191c disposed to penetrate the third central separation region 175c. The first to third ground contact structures 191a, 191b, and 191c may be connected to/directly connected to the third plate portion 103 and may apply a ground voltage to the third plate portion 103. A plurality of each of the first to third ground contact structures 191a, 191b, and 191c may be disposed in the second direction Y. At least two of the first to third ground contact structures 191a, 191b, and 191c may be disposed in zigzag form in the first direction X. At least two of the first to third ground contact structures 191a, 191b, and 191c may be disposed in zigzag form in the second direction. At least two of the first to third ground contact structures 191a, 191b, and 191c may be offset in the first direction X or the second direction Y.

Referring to FIG. 3B, the arrangement and the number of a third separation region 175" of the cell array separation structure MS2 and the arrangement, the number, and a shape of a ground contact structure 191' may be different from those of the aforementioned example embodiments.

The third separation region 175" may include a first central separation region 175a and a second central separation region 175b spaced apart from each other in the first direction X and extending in the second direction Y. As the third separation region 175" have a shape in which the first and second central separation regions 175a and 175b are disposed in two lines, an area of the separation region SR may be reduced as compared to the example embodiment illustrated in FIG. 3A.

The ground contact structure 191' may include a first ground contact structure 191a' disposed to penetrate a first central separation region 175a' and a second ground contact structure 191b' disposed to penetrate a second central separation region 175b'. The first and second ground contact structures 191a' and 191b' may be connected to/directly connected to a third plate portion 103 and may apply a ground voltage to the third plate portion 103. The first and second ground contact structures 191a' and 191b' may be disposed in zigzag form in the first direction X. The first and second ground contact structures 191a' and 191b' may be disposed in zigzag form in the second direction Y.

The first and second ground contact structures 191a' and 191b' may have an oval-shaped cross-sectional surface of which a width taken in the second direction Y is greater than a width taken in the first direction X. A width of the first and second ground contact structures 191a' and 191b' in the second direction Y may be relatively greater than a width of the ground contact structure 191 in the second direction illustrated in FIG. 3A.

Referring to FIG. 3C, a ground contact structure 191" may be configured differently from the aforementioned example embodiment. As compared to FIGS. 3A and 3B, an area of the separation region SR may be reduced.

The ground contact structure 191" may have a line-shape extending in the second direction X. The ground contact structure 191" may penetrate a third separation region 175 and may extend in the second direction Y and the third direction Z. The ground contact structure 191" in FIG. 3C may also be applied to the some example embodiments in FIGS. 3A and 3B and modified some example embodiments. The embodiments disclosed in FIGS. 3A-3C are not to be construed as mutually exclusive. For example, a semiconductor device may have some features from FIG. 3A, some from FIG. 3B, and some from FIG. 3C.

Figure 4A:
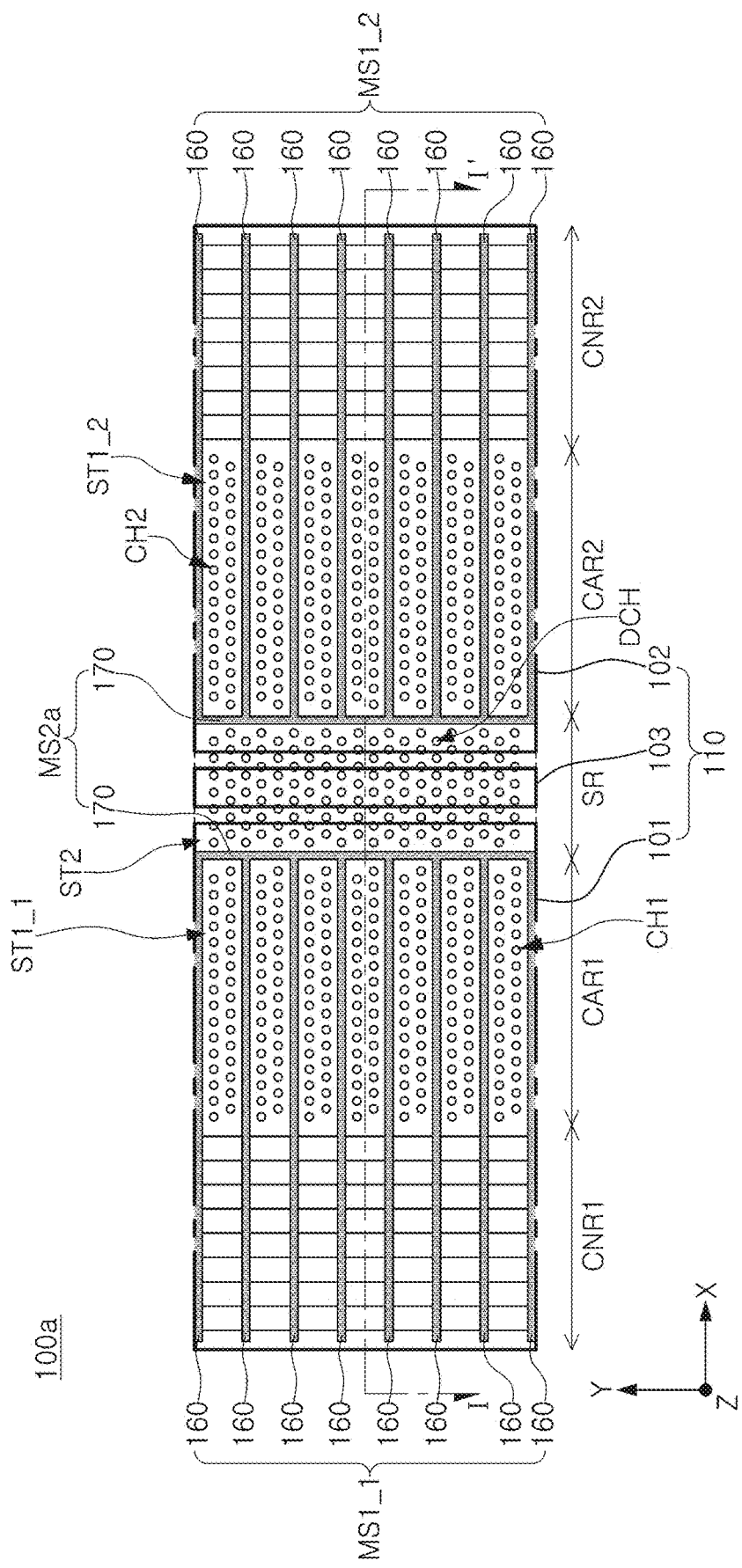
FIG. 4A is a schematic plan diagram illustrating a semiconductor device according to some example embodiments of inventive concepts.
Figure 4B:
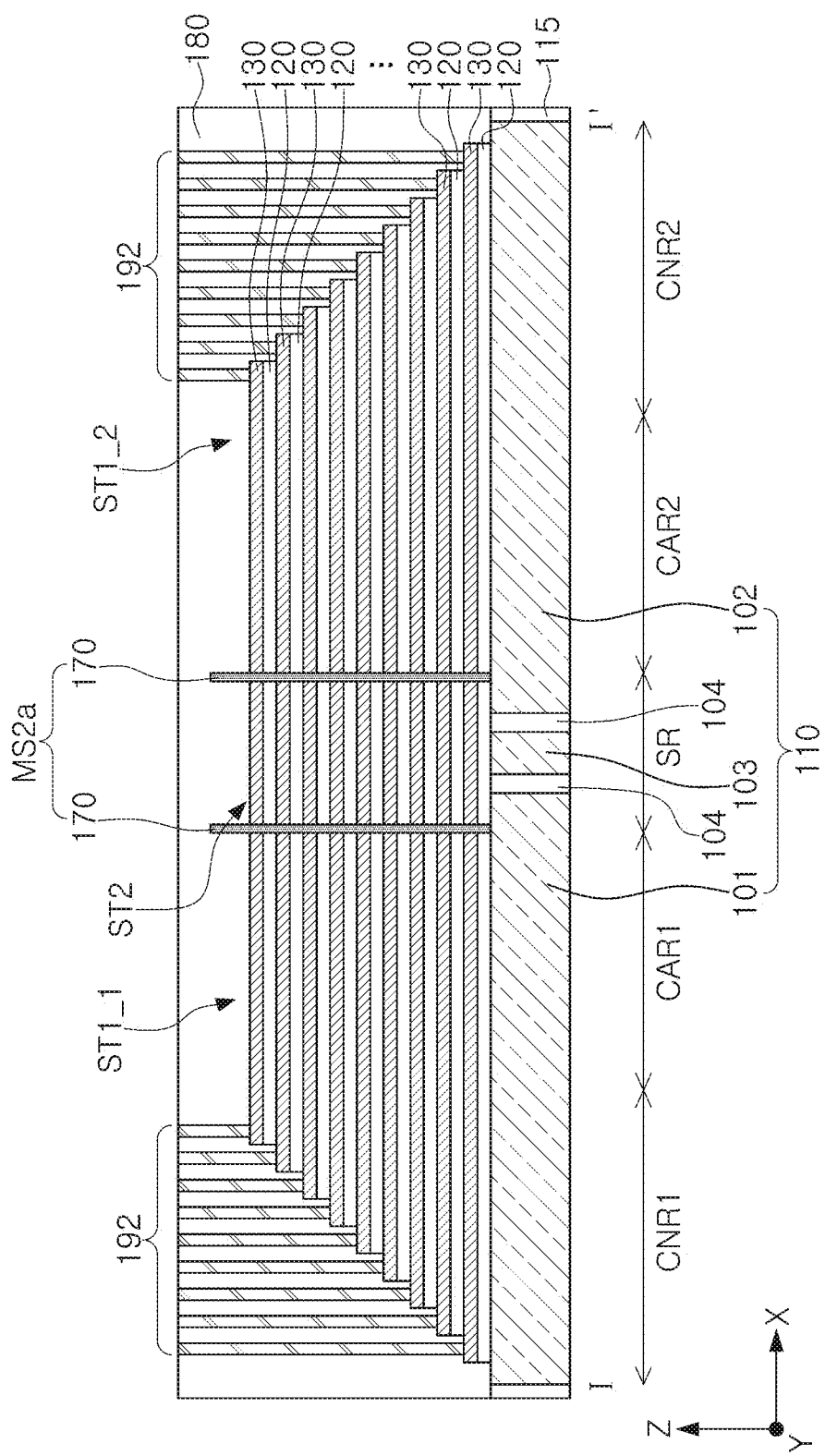
FIG. 4B is a cross-sectional diagram along line I-I' in FIG. 4A.

FIG. 4A is a schematic plan diagram illustrating a semiconductor device according to some example embodiments. FIG. 4B is a cross-sectional diagram along line I-I' in FIG. 4A.

Referring to FIGS. 4A and 4B, in a semiconductor device 100a, a cell array separation structure MS2a and a third stack structure ST2 may be configured differently from the example embodiment illustrated in FIGS. 2A to 3C. The semiconductor device 100a may not include a ground contact structure 191 (see FIG. 2A).

The cell array separation structure MS2a may include second separation regions 170 connected to/directly connected to ends of first separation regions 160, and may not include a third separation region 175 (see FIG. 2A). At least two second separation regions 170 may be disposed to be connected to first and second plate portions 101 and 102, respectively. A lower end of the second separation region 170 may not be in contact with a lower separation region 104.

The third stack structure ST2 may be disposed between a pair of the second separation regions 170 disposed side by side in the first direction X.

Figure 5A:
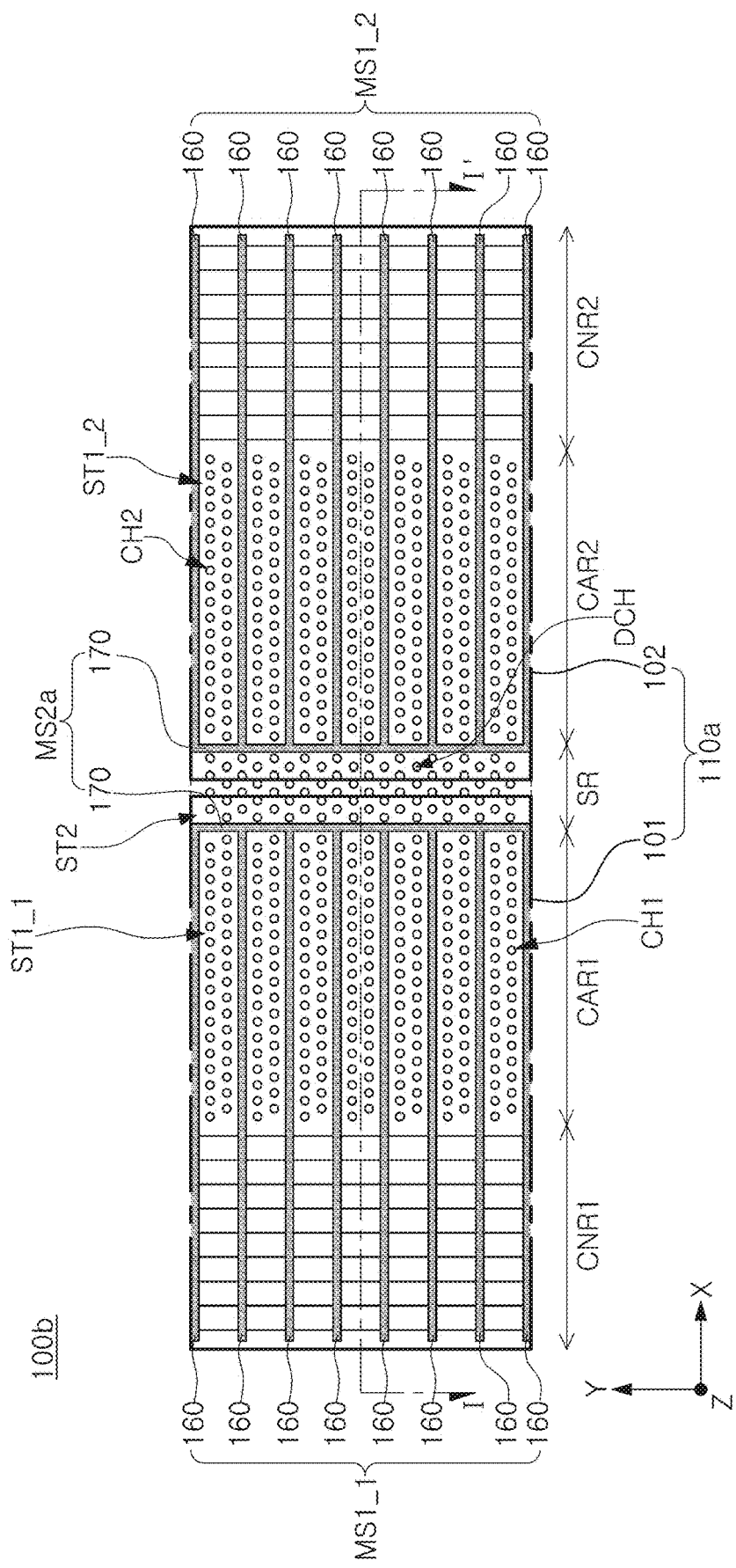
FIG. 5A is a schematic plan diagram illustrating a semiconductor device according to some example embodiments of inventive concepts.
Figure 5B:
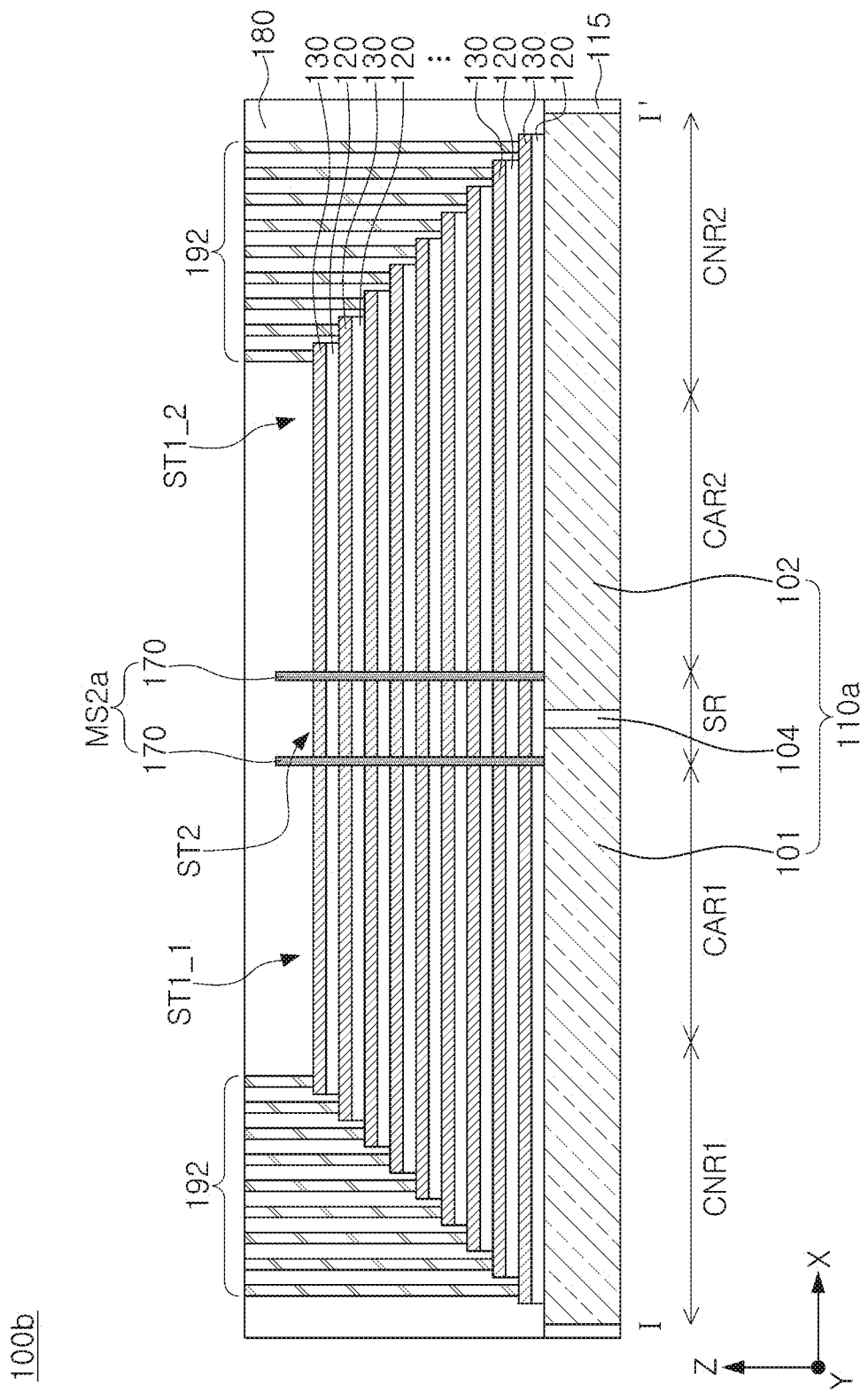
FIG. 5B is a cross-sectional diagram along line I-I' in FIG. 5A.

FIG. 5A is a schematic plan diagram illustrating a semiconductor device according to some example embodiments. FIG. 5B is a cross-sectional diagram along line I-I' in FIG. 5A. Referring to FIGS. 5A and 5B, in a semiconductor device 100b, a first substrate 110a may be configured differently from the example illustrated in FIGS. 2A to 3C. A cell array separation structure MS2a and a third stack structure ST2 may be configured similarly to the example illustrated in FIGS. 4A and 4B.

The first substrate 110a may be divided into a first plate portion 101 and a second plate portion 102 by a lower separation region 104. The first substrate 110a may not include a third plate portion 103 (see FIG. 2A). A lower end of the second separation region 170 may not be in contact with the lower separation region 104.

Figure 6A:
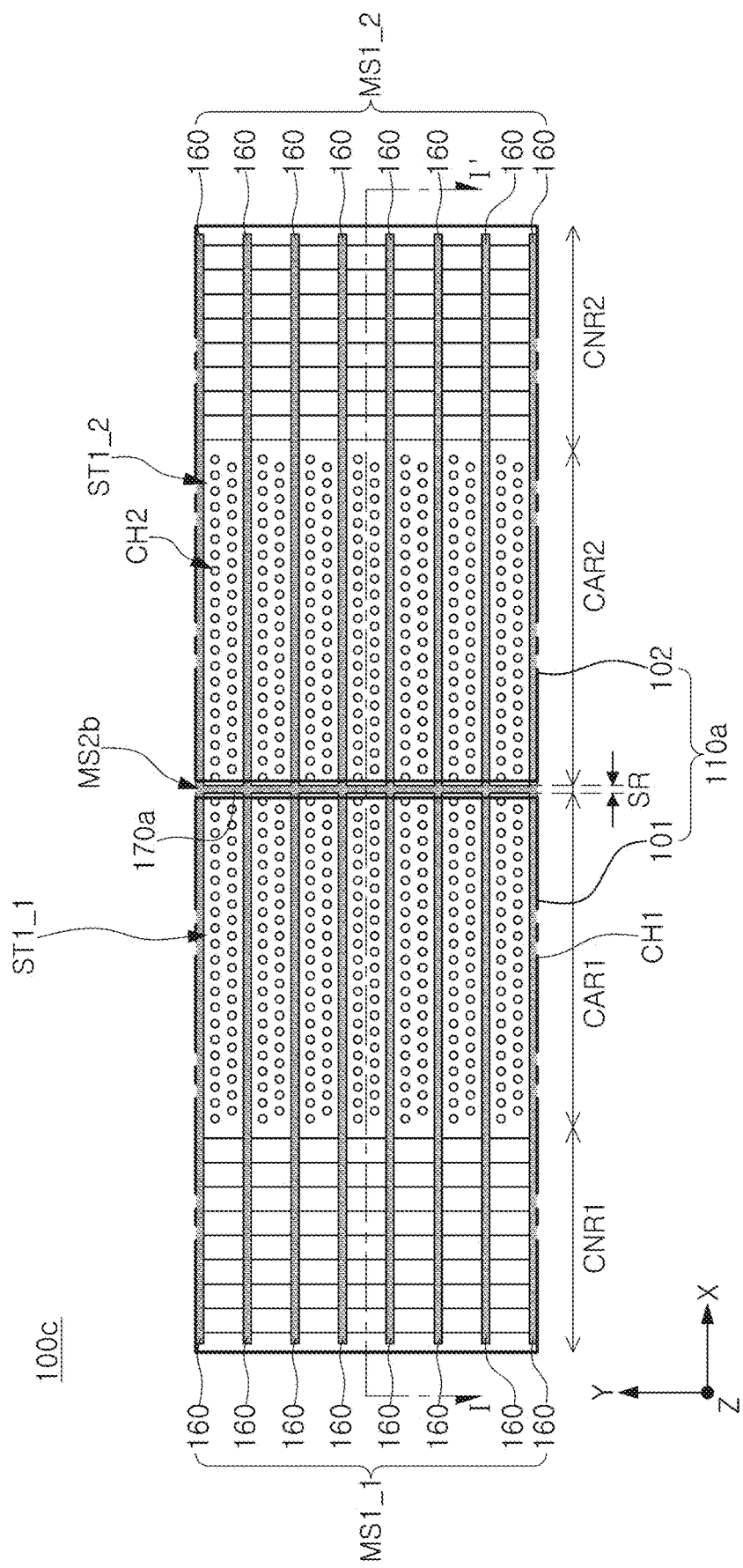
FIG. 6A is a schematic plan diagram illustrating a semiconductor device according to some example embodiments of inventive concepts.
Figure 6B:
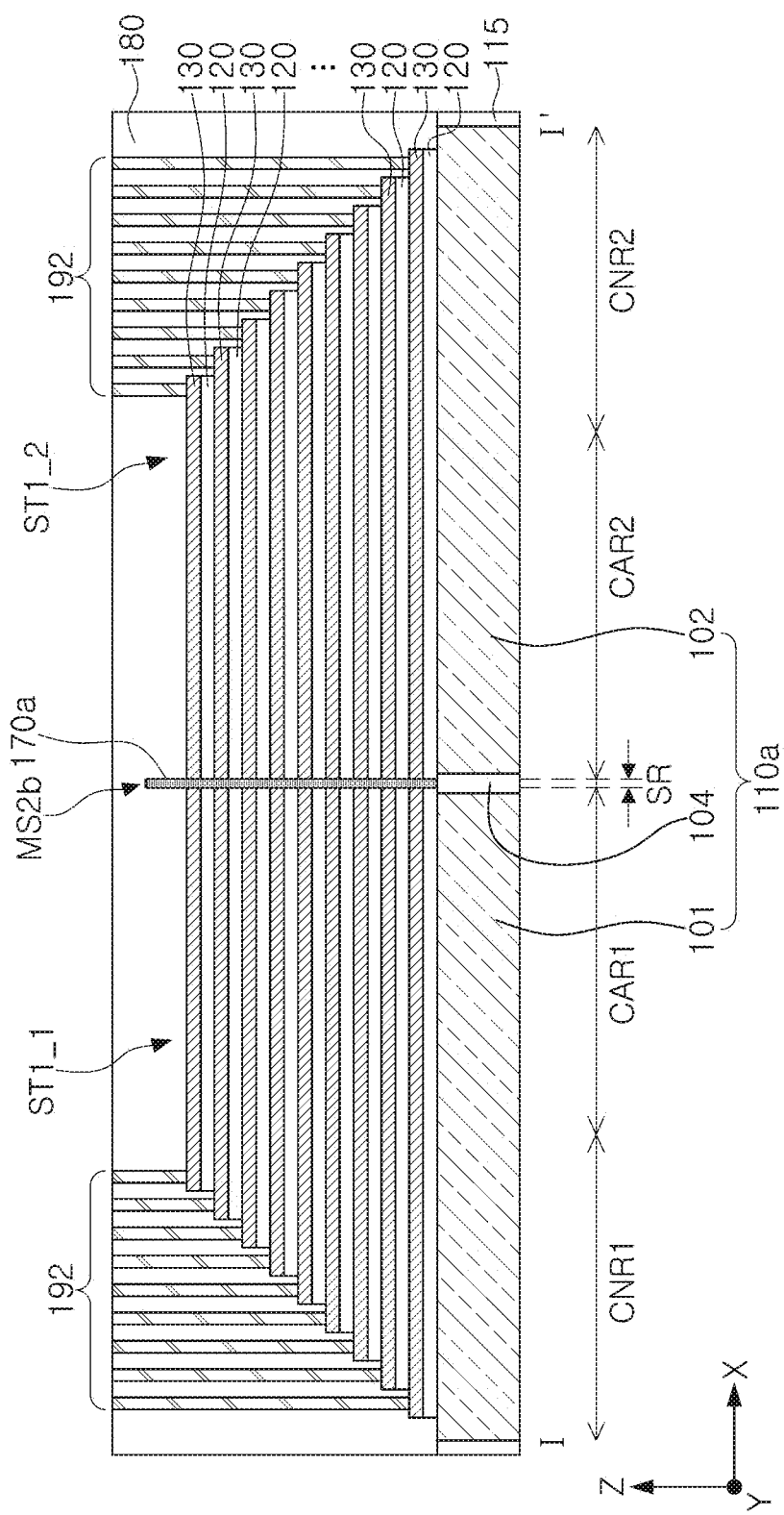
FIG. 6B is a cross-sectional diagram along line I-I' in FIG. 6A.

FIG. 6A is a schematic plan diagram illustrating a semiconductor device according to some example embodiments. FIG. 6B is a cross-sectional diagram along line I-I' in FIG. 6A.

Referring to FIGS. 6A and 6B, in a semiconductor device 100c, a cell array separation structure MS2b may be configured differently from the example illustrated in FIGS. 2A to 3C. A first substrate 110a may be configured similarly to the example illustrated in FIGS. 5A and 5B.

The cell array separation structure MS2b may include a second separation region 170a for dividing stack structures ST1_1 and ST1_2 into two structures in the first direction X. The second separation region 170a may be disposed on a lower separation region 104. A lower end of the second separation region 170a may be in contact with the lower separation region 104. A width of the second separation region 170a in the first direction X may be the same or substantially the same as or less or greater than a width of the lower separation region 104 in the first direction X.

Figure 7A:
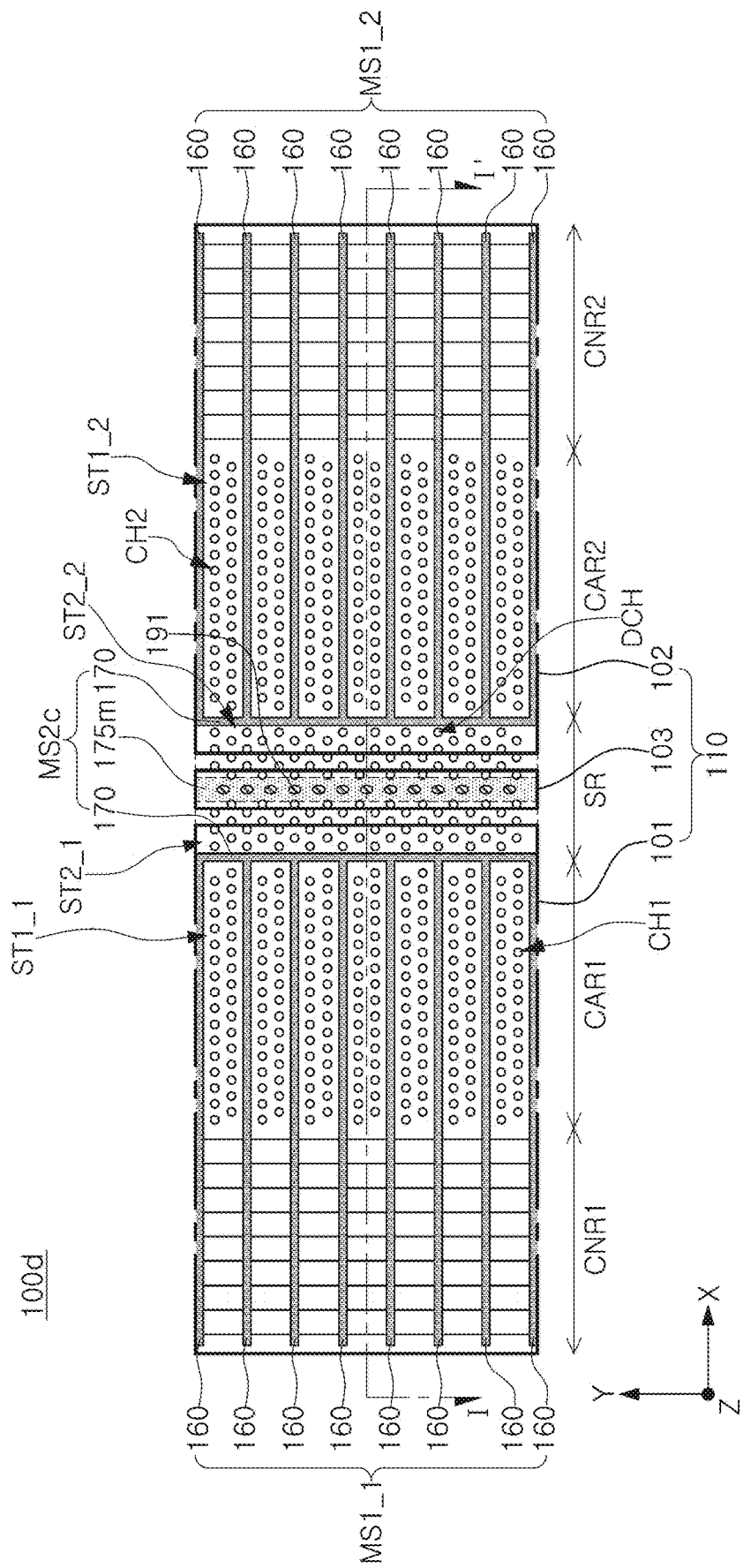
FIG. 7A is a schematic plan diagram illustrating a semiconductor device according to some example embodiments of inventive concepts.
Figure 7B:
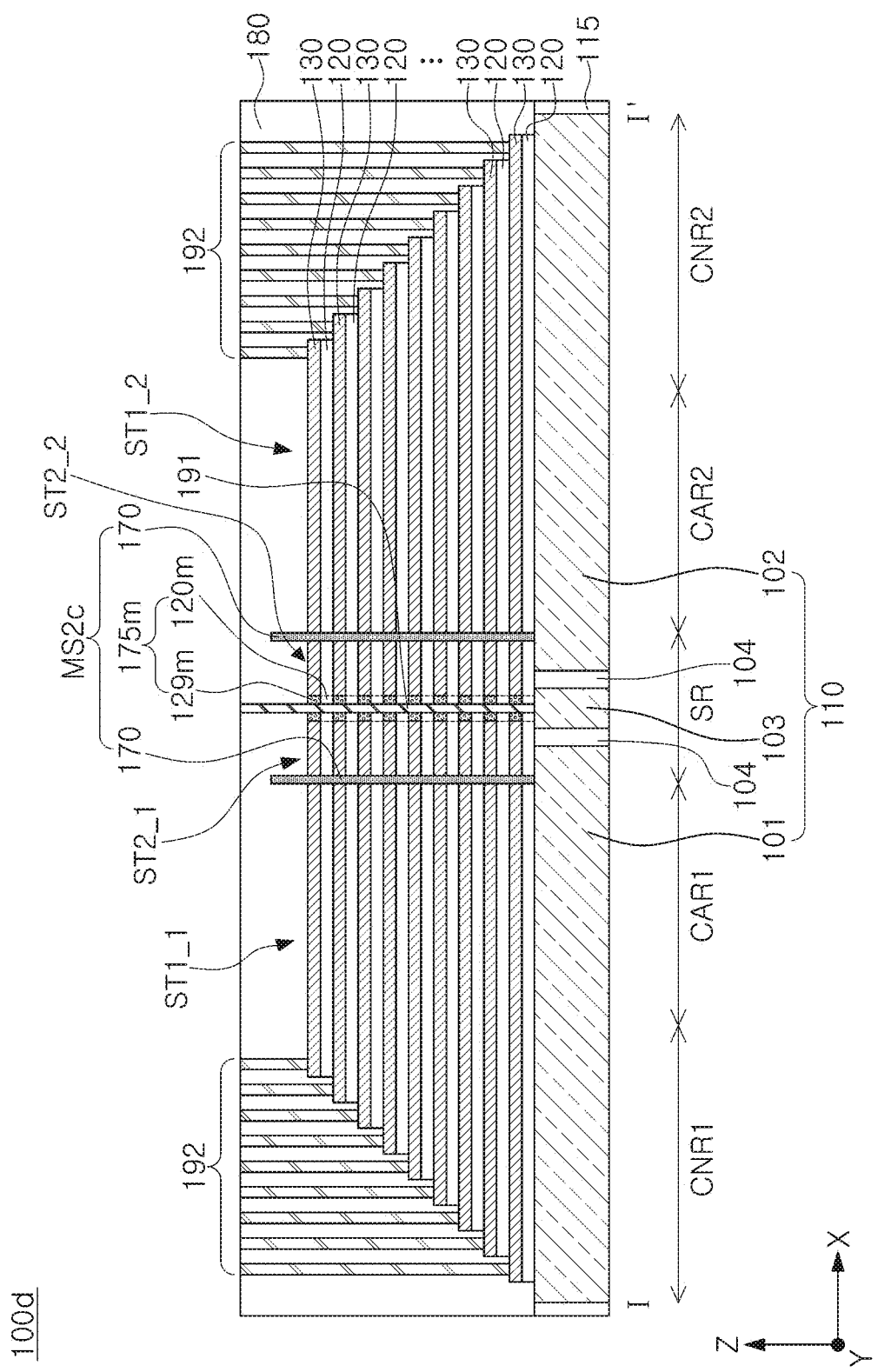
FIG. 7B is a cross-sectional diagram along line I-I' in FIG. 7A.

FIG. 7A is a schematic plan diagram illustrating a semiconductor device according to some example embodiments. FIG. 7B is a cross-sectional diagram along line I-I' in FIG. 7A.

Referring to FIGS. 7A and 7B, in a semiconductor device 100d, a third separation region 175m of a cell array separation structure MS2c may be configured different from example embodiments illustrated in FIGS. 2A to 3C.

The third separation region 175m may include first layers 120m and second layers 129m alternately stacked on the first substrate 110. The second layers 129m may include a material the same as a material of interlayer insulating layers 120. The first layers 120m may be disposed on a level the same or substantially the same as a level of the interlayer insulating layers 120. The second layers 129m may include a material different from a material of gate electrodes 130. The second layers 129m may be disposed on a level the same or substantially the same as the gate electrodes 130.

Ground contact structures 191 may penetrate the first layers 120*m* and the second layers 129*m* in the third direction Z and may be electrically connected/directly electrically connected to the third plate portion 103. The example embodiments disclosed in FIGS. 4A-7B may not be mutually exclusive with one another. For example, a semiconductor device may include some features from any or all of FIGS. 4A-7B.

Figure 8A:
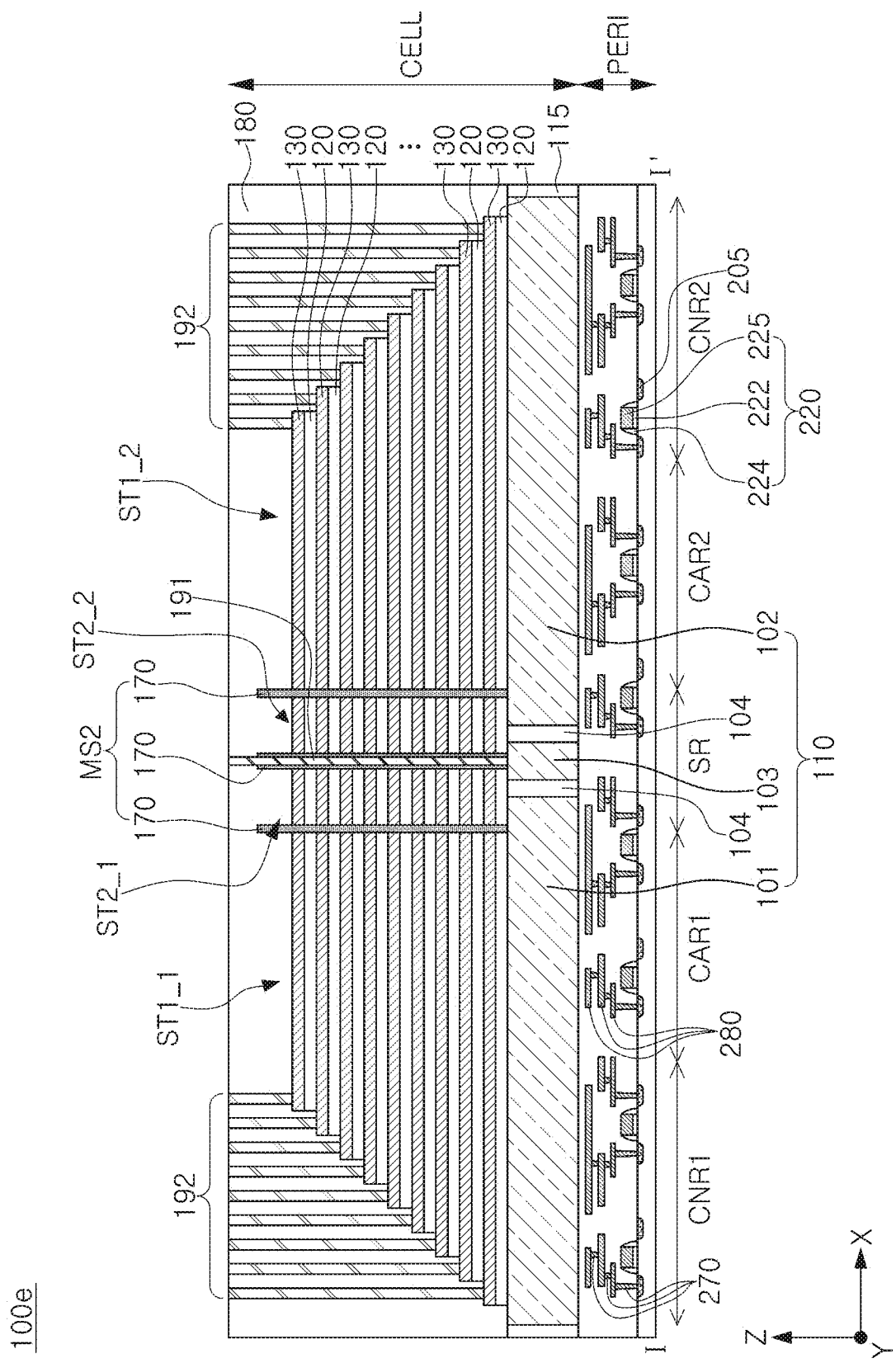
FIGS. 8A and 8B are cross-sectional diagrams illustrating a semiconductor device according to some example embodiments of inventive concepts.

FIG. 8A is a cross-sectional diagram illustrating a semiconductor device according to some example embodiments, illustrating a region corresponding to FIG. 2B.

Figure 8B:
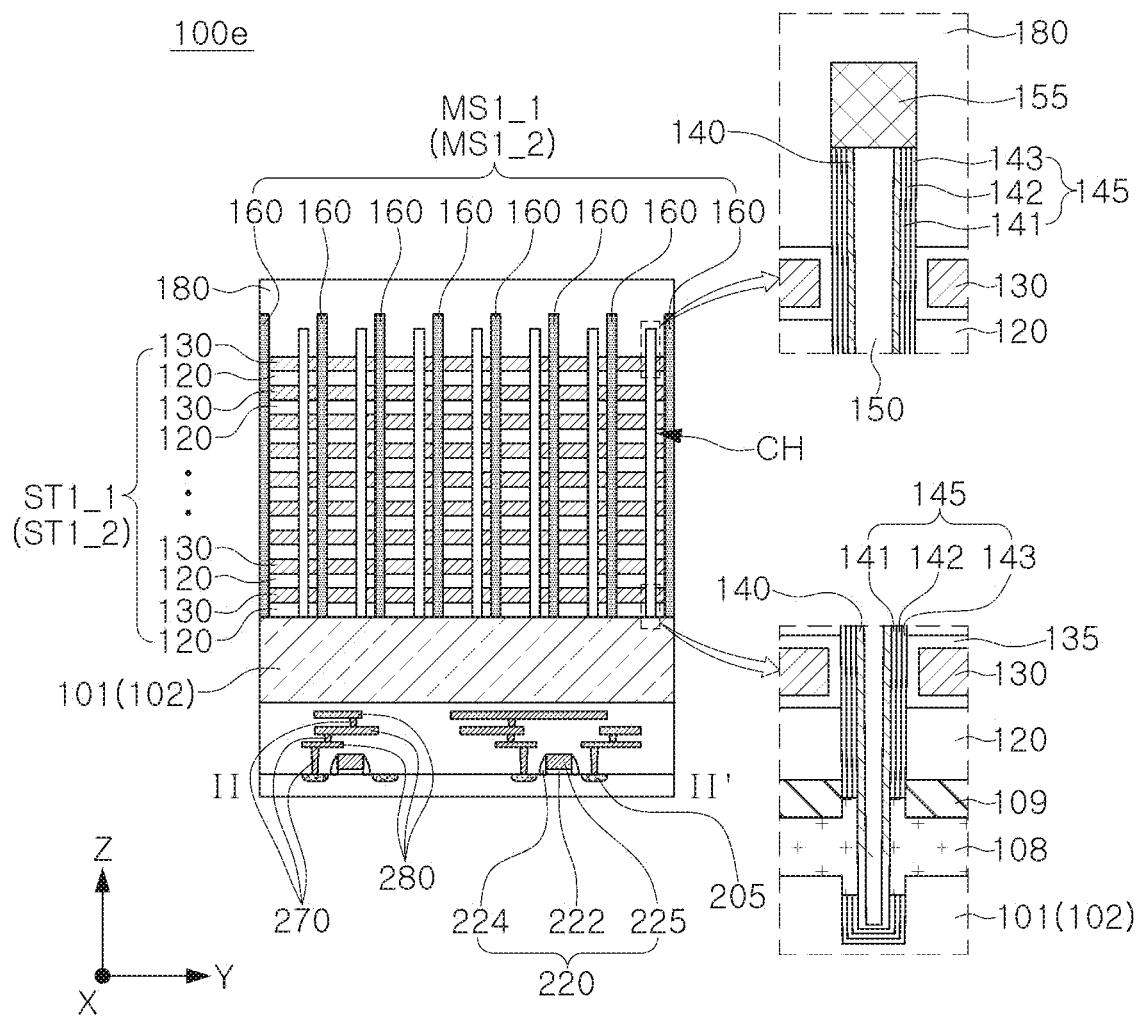

FIG. 8B is a cross-sectional diagram illustrating a semiconductor device according to some example embodiments, illustrating a region corresponding to FIG. 2C.

Referring to FIGS. 8A and 8B, a semiconductor device 100*e* may include a memory cell region CELL and a peripheral circuit region PERI. The memory cell region CELL may be disposed on an upper end of the peripheral circuit region PERI. In some example embodiments, the memory cell region CELL may also be disposed on a lower end of the peripheral circuit region PERI.

As illustrated in the aforementioned example embodiments with reference to FIGS. 2A to 2C, the memory cell region CELL may include a first substrate 110, interlayer insulating layers 120, gate electrodes 130, channel structures CH1 and CH2, first and second block separation structures MS1_1 and MS1_2, a cell array separation structure MS2, a dummy channel structure DCH, a capping insulating layer 180, a ground contact structure 191, and a gate contact structure 192. The memory cell region CELL may have a structure according to the some example embodiments illustrated in FIGS. 2A to 7B. The memory cell region CELL may also have a structure according to the some example embodiments illustrated in FIGS. 9A to 10B.

The peripheral circuit region PERI may include a base substrate 201, circuit devices 220 disposed on the base substrate 201, circuit contact plugs 270, and circuit wiring lines 280.

The base substrate 201 may have an upper surface extending in the first direction X and the second direction Y. In the base substrate 201, device separation layers may be formed such that an active region may be defined. Source/drain regions 205 including impurities may be partially disposed in the active region. The base substrate 201 may include a semiconductor material, such as a group IV semiconductor, a group III-V compound semiconductor, or a group II-VI compound semiconductor, for example.

The circuit devices 220 may include a planar transistor. Each of the circuit devices 220 may include a circuit gate insulating layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate the peripheral region insulating layer 290 and may be connected to the source/drain regions 205. An electrical signal may be applied to the circuit device 220 by the circuit contact plugs 270. In the region not illustrated in the diagram, the circuit contact plugs 270 may also be connected to the circuit gate electrode 225. The circuit wiring lines 280 may be connected to the circuit contact plugs 270, and may include a plurality of layers. The gate electrodes 130 of the memory cell region CELL may be connected to the circuit devices 220 of the peripheral circuit region PERI through a though region penetrating the peripheral circuit region PERI and a through via disposed in the through region in the region not illustrated in the diagram.

In the semiconductor device 100*e*, the peripheral circuit region PERI may be manufactured/fabricated preferentially, and the first substrate 110 of the memory cell region CELL may be formed on the peripheral circuit region PERI such that the memory cell region CELL may be manufactured.

Figure 9A:
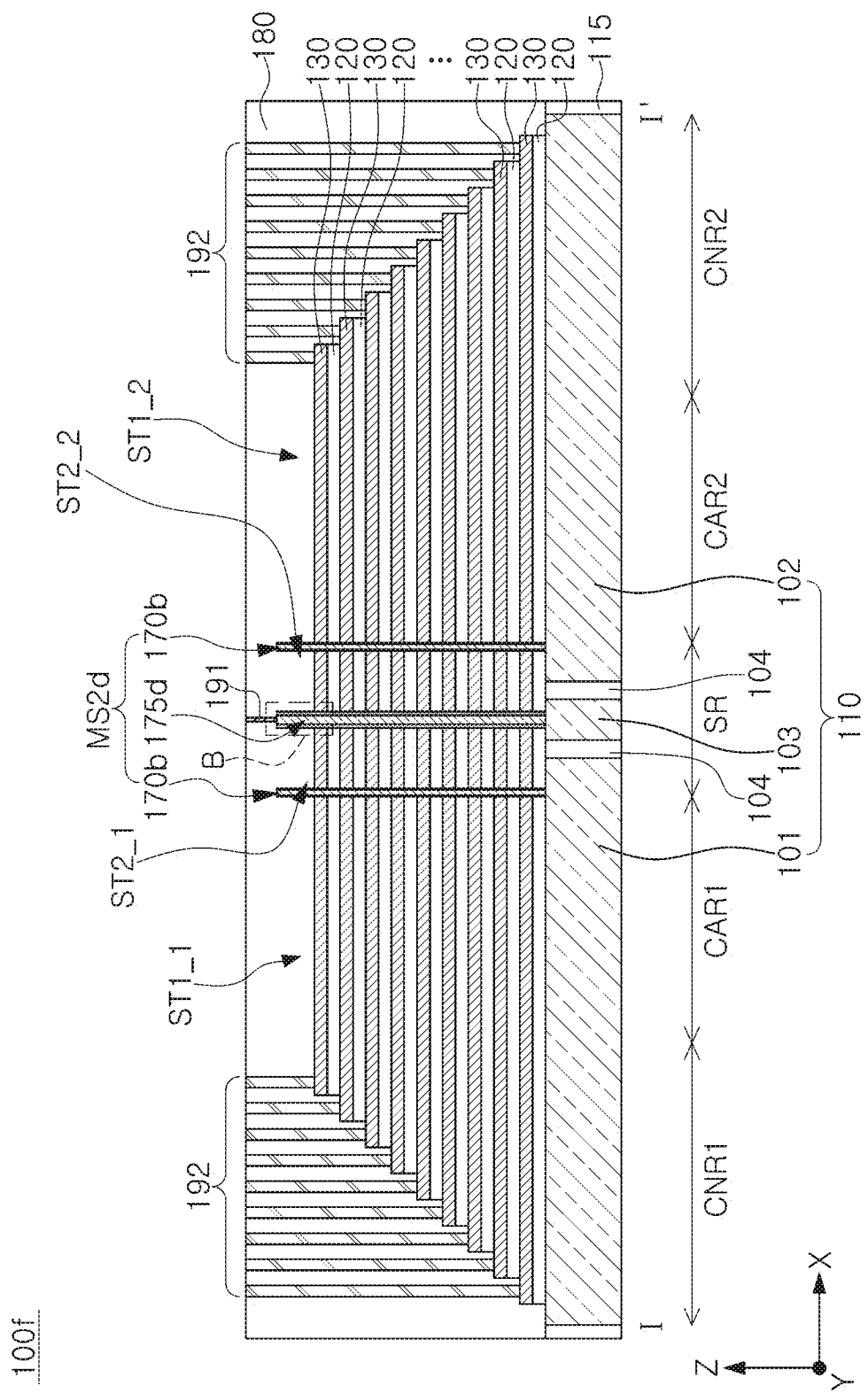
FIGS. 9A and 9B are cross-sectional diagrams illustrating a semiconductor device according to some example embodiments of inventive concepts.

FIG. 9A is a cross-sectional diagram illustrating a semiconductor device according to some example embodiments, illustrating a region corresponding to FIG. 2B.

Figure 9B:
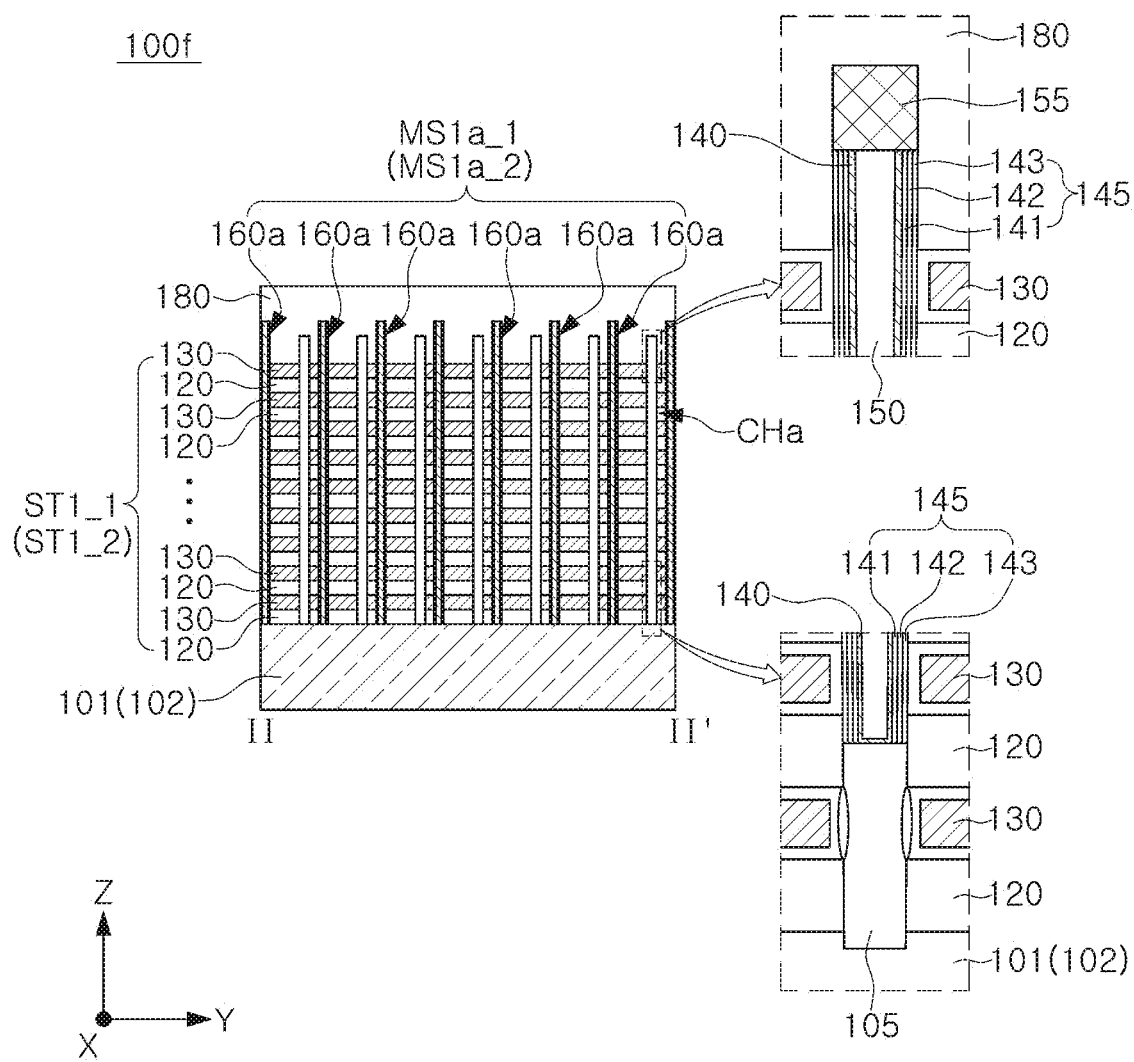

FIG. 9B is a cross-sectional diagram illustrating a semiconductor device according to some example embodiments, illustrating a region corresponding to FIG. 2C.

Figure 9C:
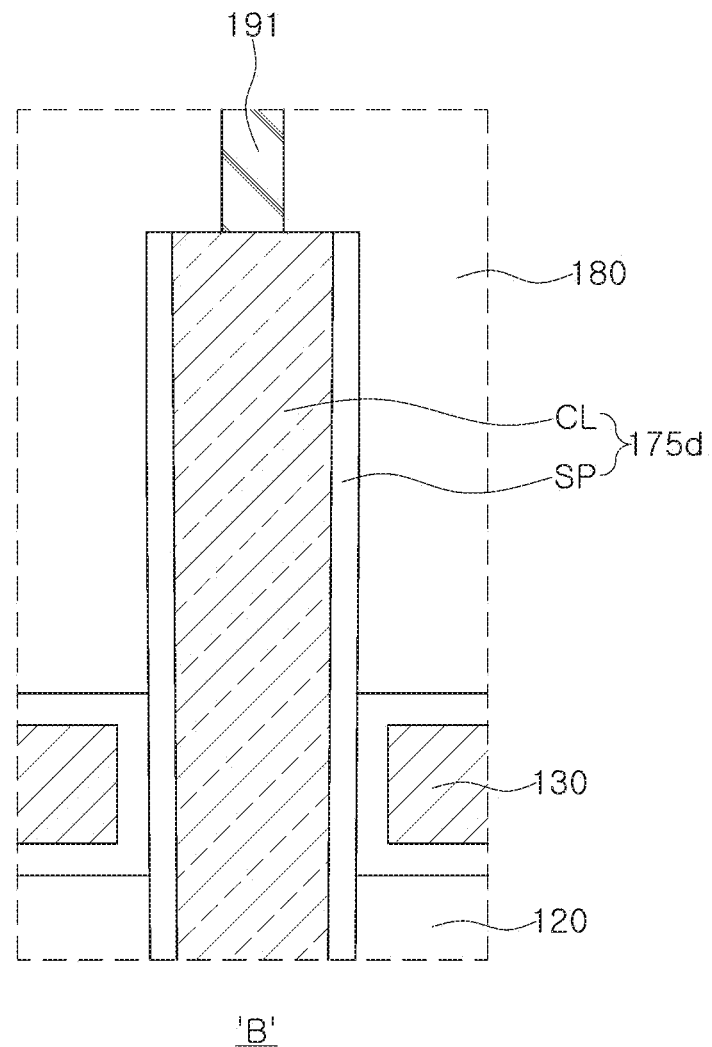
FIG. 9C is an enlarged cross-sectional diagram illustrating a portion of a semiconductor device according to some example embodiments of inventive concepts.

FIG. 9C is a cross-sectional diagram illustrating a semiconductor device according to some example embodiments, illustrating portion "B" illustrated in FIG. 9A in enlarged form.

Referring to FIGS. 9A to 9C, in a semiconductor device 100*f*, a channel structure CHa, a first separation region 160*a* of first and second separation structures MS1a_1 and MS1a_2, and a second separation region 170*b* and a third separation region 175*d* of a cell array separation structure MS2d may be configured differently from the aforementioned some example embodiments illustrated in FIGS. 2A to 8B.

Each of the first separation region 160*a*, the second separation region 170*d*, and the third separation region 175*d* may include a conductive layer CL and an insulating spacer SP covering side surfaces of the conductive layer CL. The conductive layer CL may be spaced apart from gate electrodes 130 by the insulating spacer SP. The conductive layer CL may include the common source line CSL described with reference to FIG. 1B. A ground contact structure 191 may be disposed to be in contact with an upper end of the conductive layer CL of the third separation region 175*d*. In some example embodiments, contact structures electrically connected to the conductive layer CL of the first and second separation regions 160*a* and 170*d* may be further disposed.

The channel structure CHa may further include an epitaxial layer 105 in contact with, e.g. in direct contact with, first and second plate portions 101 and 102 of a first substrate 110 below a channel layer 140. The semiconductor device 100*f* may not include first and second horizontal conductive layers 108 and 109 (see FIG. 2C). The epitaxial layer 105 may be disposed on a side surface of at least one gate electrode 130. The epitaxial layer 105 may be disposed in a recessed region of the first substrate 110. The channel layer 140 may be electrically connected to the first and second plate portions 101 and 102 of the first substrate 110 through the epitaxial layer 105.

Figure 10A:
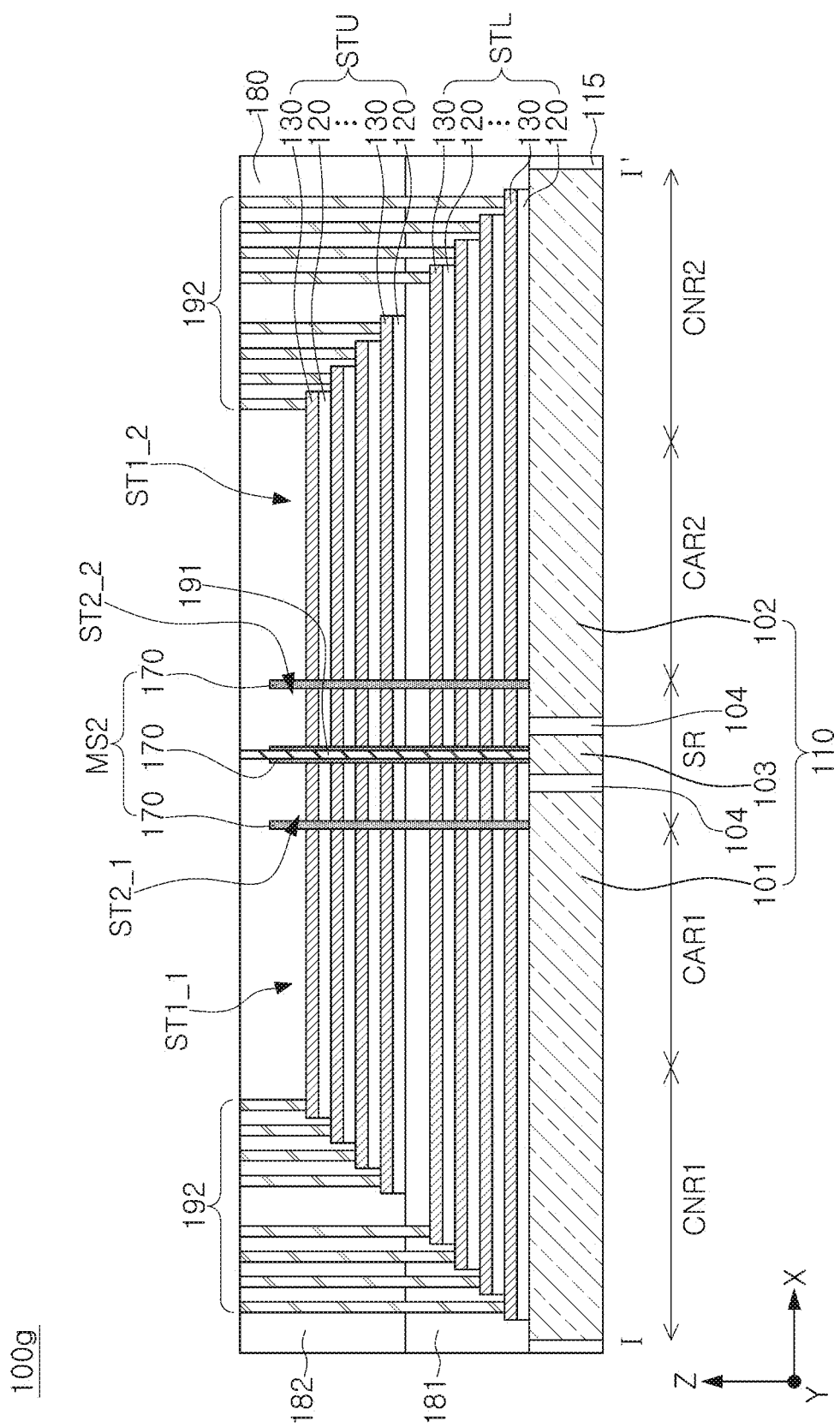
FIGS. 10A and 10B are cross-sectional diagrams illustrating a semiconductor device according to some example embodiments of inventive concepts.

FIG. 10A is a cross-sectional diagram illustrating a semiconductor device according to some example embodiments, illustrating a region corresponding to FIG. 2B.

Figure 10B:
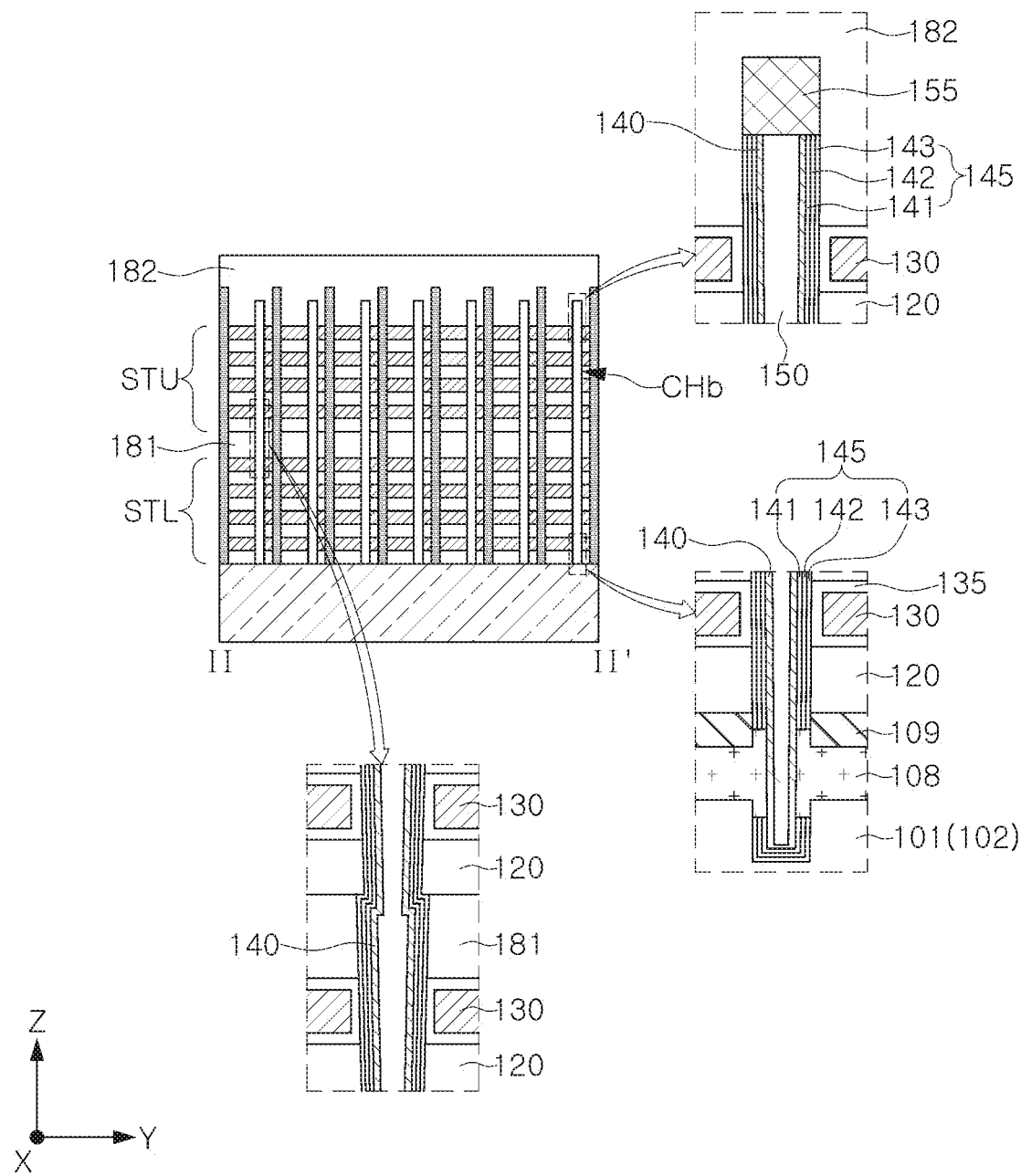
Figure 11A:
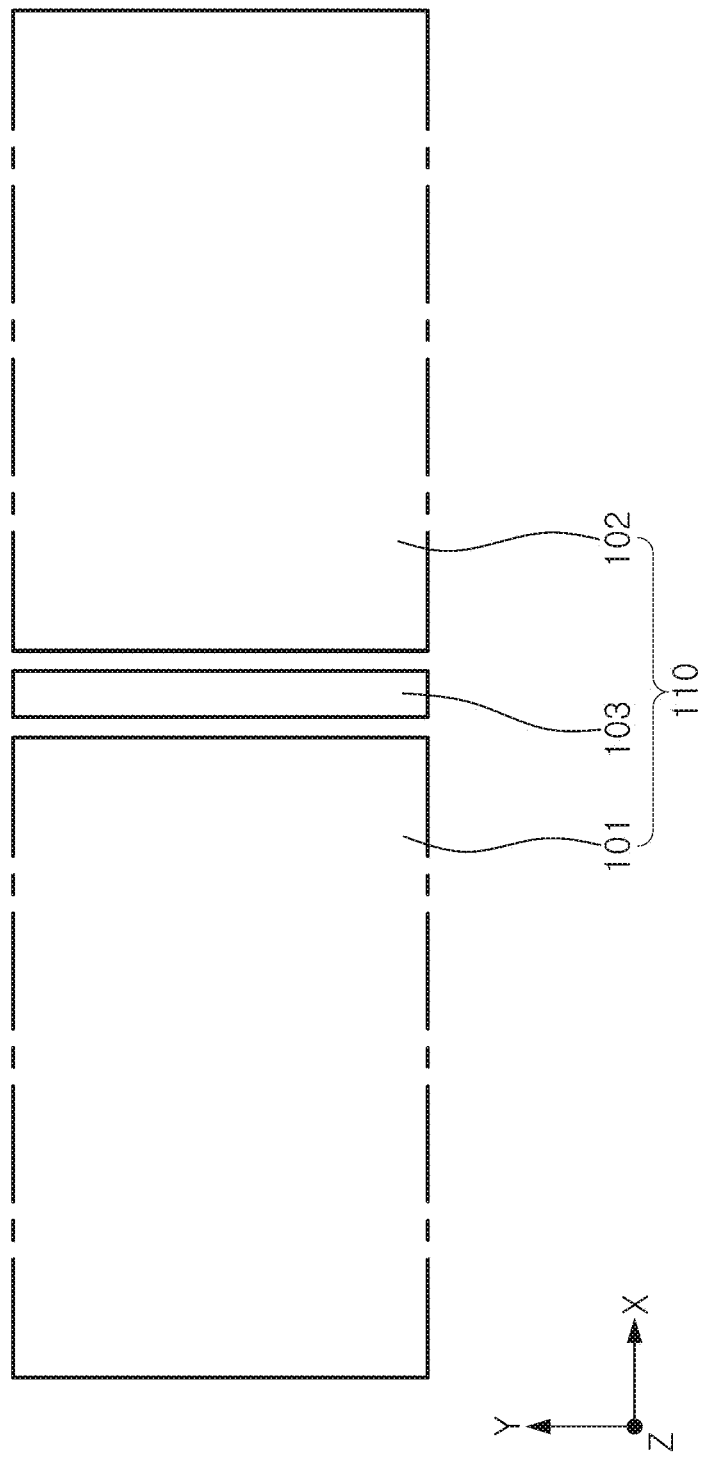
FIGS. 11A to 14B are schematic plan diagrams and cross-sectional diagrams illustrating a method of manufacturing a semiconductor device according to some example embodiments of inventive concepts.
Figure 11B:
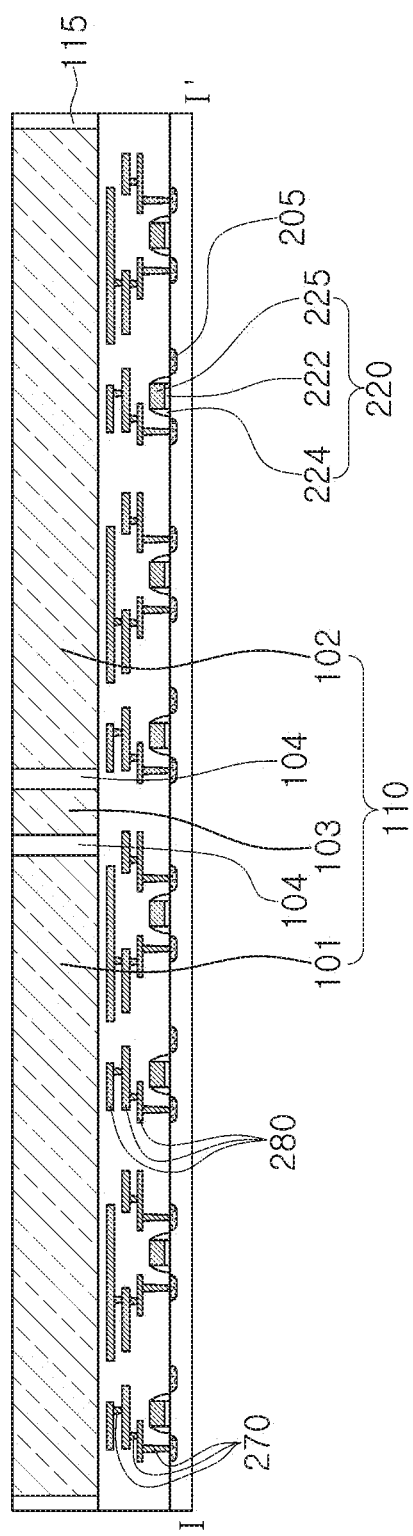

FIG. 10B is a cross-sectional diagram illustrating a semiconductor device according to some example embodiments, illustrating a region corresponding to FIG. 2C.

Referring to FIGS. 10A and 10B, in a semiconductor device 100*g*, a stack structure may include lower and upper stacked structures STL and STU vertically stacked, and channel structures CHb may include lower and upper channel structures vertically stacked. The semiconductor device 100*g* may include a first capping insulating layer 181 covering the lower stacked structure STL and a second capping insulating layer 182 covering the upper stacking structure STU. The first and second block separation structures MS1_1 and MS1_2 and the cell array separation structure MS2 may be disposed to penetrate the lower and stacked structures STL and STU.

The channel structures CHb may have a form in which the lower channel structure is connected to the upper channel structure, and may have a bent portion formed by a difference in width in a connection area. A channel layer 140, a gate dielectric layer 145, and a channel insulating layer 150 may be connected to each other between the lower channel structure and the upper channel structure. A channel pad 155 may be disposed only on an upper end of the upper channel structure. However, in some example embodiments, each of the lower channel structure and the upper channel structure may include the channel pad 155, and in this case, the channel pad 155 of the lower channel structure may be connected to the channel layer 140 of the upper channel structure.

A portion of the gate contact structures 192 may penetrate the first and second capping insulating layers 181 and 182 and may be connected to gate electrodes 130 of the lower stacked structure STL, respectively. The other portion of the gate contact structures 192 may penetrate the second capping insulating layer 182 and may be connected to the gate electrodes 130 of the upper stacked structure STU, respectively.

FIGS. 11A to 14B are schematic plan diagrams and cross-sectional diagrams illustrating a method of manufacturing a semiconductor device according to some example embodiments.

Referring to FIGS. 11A to 14B, a lower separation region 104 which may divide a first substrate 110 into a first plate portion 101, a second plate portion 102, and a third plate portion 103 may be formed.

Prior to this process, a peripheral circuit region PERI including a second, base substrate 201 and circuit devices 220 may be preferentially formed below the first substrate 110. Differently from this process, a memory cell region CELL including the first substrate 110, an interlayer insulating layer 120, a gate electrode 130, a channel structure CH, first and second block separation structures MS1_1 and MS1_2, and a cell array separation structure MS2 may be formed, and may be bonded to the peripheral circuit region PERI.

The lower separation region 104 may be formed to completely penetrate the first substrate 110 in the third direction Z. The lower separation region 104 may be configured to extend in the second direction Y.

In this process, in the lower separation region 104, the first substrate 110a may be configured to be divided into a first plate portion 101 and a second plate portion 102 such that the semiconductor device 100b and 100c in FIGS. 5A to 6B may be obtained.

Figure 12A:
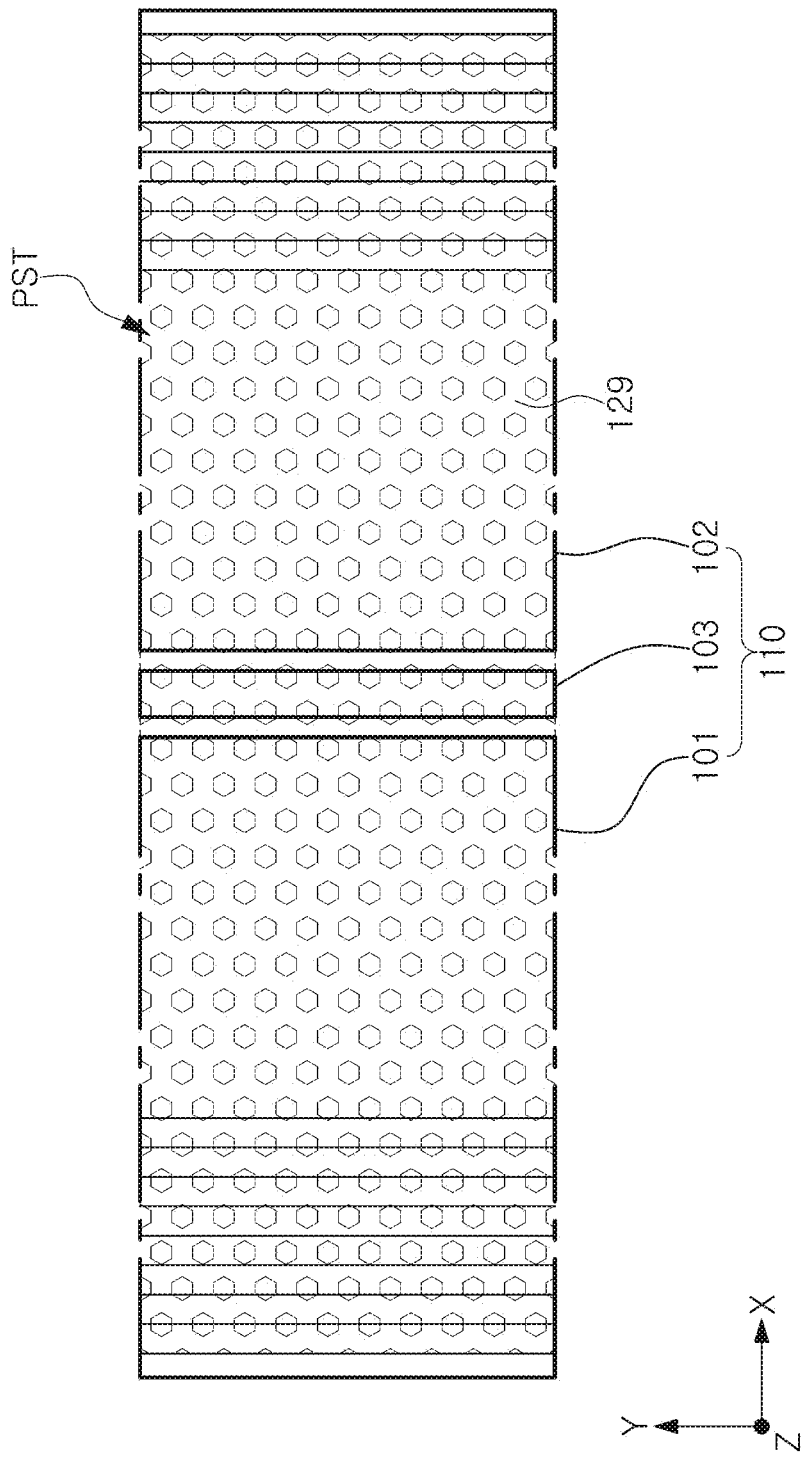
Figure 12B:
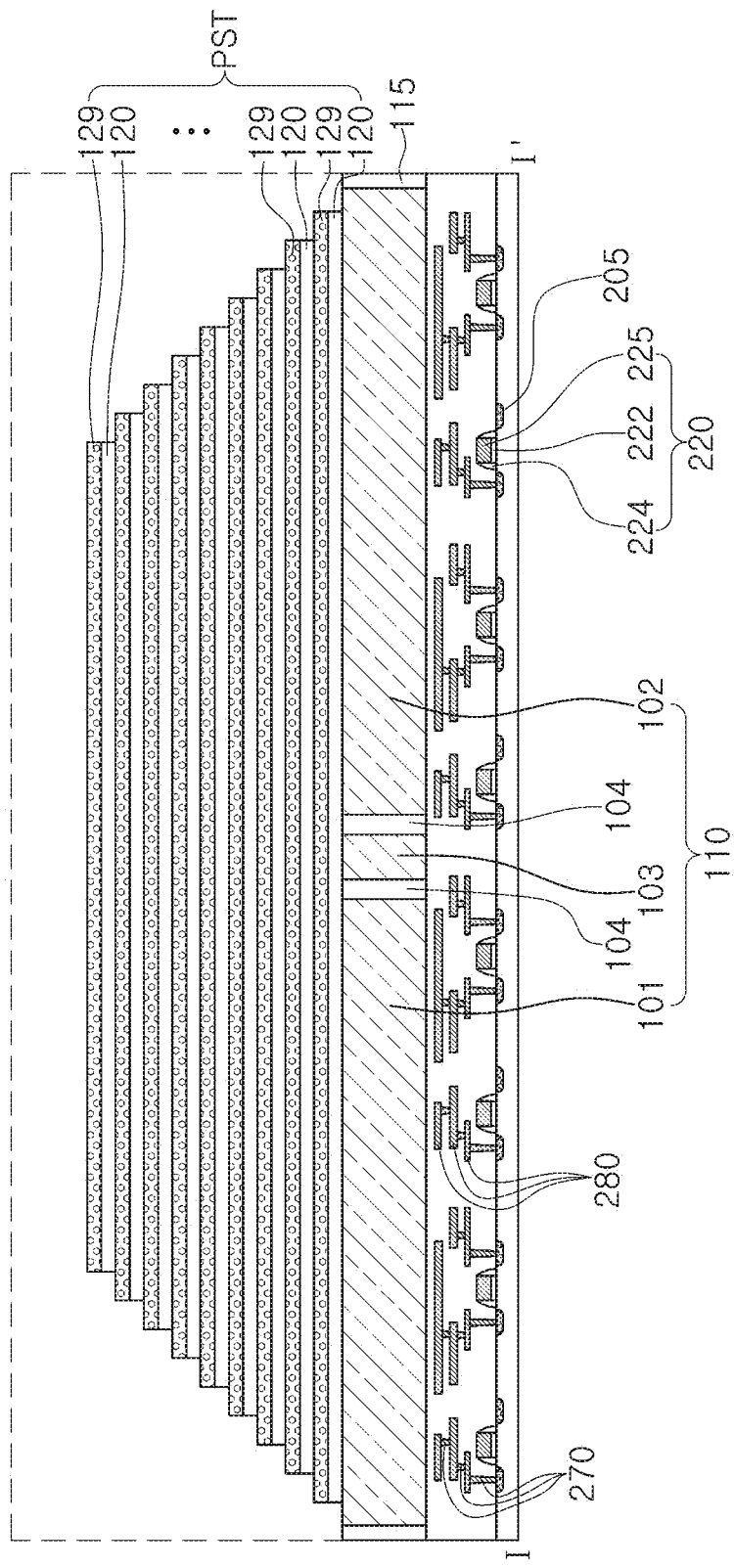

Referring to FIGS. 12A and 12B, sacrificial layers 129 and interlayer insulating layers 120 may be alternately stacked on the first substrate 110, and the sacrificial layers 129 and the interlayer insulating layers 120 may be partially removed such that the sacrificial layers 129 may extend by different lengths in the first direction X.

The sacrificial layers 129 and the interlayer insulating layers 120 may be alternately deposited by a deposition process, such as an atomic layer deposition process, to form a preliminary stack structure PST. Thicknesses of the interlayer insulating layers 120 and the sacrificial layers 129 and the number of layers of the interlayer insulating layers 120 and the sacrificial layers 129 may be varied and different from the examples illustrated in the diagram.

A photolithography process, such as an immersion photolithography process, and an etching process, such as a dry-etching process, may be repeatedly performed on the sacrificial layers 129 such that the upper sacrificial layers 129 may extend shorter than the lower sacrificial layers 129 in first and second staircase regions CNR1 and CNR2 illustrated in FIGS. 2A and 2B. Accordingly, the sacrificial layers 129 may have a staircase shape.

Before forming the preliminary stack structure PST, horizontal insulating layers and a second horizontal conductive layer 109 may be formed on the first substrate 110.

Referring to 13A and 13B, channel structures CH1 and CH2 penetrating through the preliminary stacked structure PST may be formed. Trenches for penetrating the preliminary stacked structure PST may be formed. The exposed sacrificial layers 129 may be removed through the trenches.

Firstly, a capping insulating layer 180 covering an upper portion of the preliminary stacked structure PST may be formed. The channel structures CH1 and CH2 may be formed by anisotropically etching, e.g. with a dry etching process, the sacrificial layers 129 and the interlayer insulating layers 120, and may be formed by forming hole-shaped channel holes and filling the holes. The channel structures CH1 and CH2 may be formed to be recessed into a portion of the first substrate 110.

Thereafter, a gate dielectric layer 145, a channel layer 140, a channel insulating layer 150, and a channel pad 155 may be formed, e.g. formed with a chemical vapor deposition (CVD) process, in order in the channel holes.

The gate dielectric layer 145 may be formed to have a uniform or substantially uniform thickness. The channel layer 140 may be formed on the gate dielectric layer 145 in the channel structure CH. The channel insulating layer 150 may be formed to fill the channel structures CH1 and CH2, and may be an insulating material.

Thereafter, trenches may be formed in a region in which the first and second block separation structures MS1_1 and MS1_2 and the cell array separation structure MS2 are formed by forming a mask layer using a photolithography process and anisotropically etching the preliminary stacked structure PST. Before the trenches are formed, a capping insulating layer 180 may be additionally formed on the channel structures CH1 and CH2 to protect the lower structures.

The trenches may include first trenches T1 extending in the first direction X and second trenches T2 extending in a second direction Y. The first trenches T1 may separate the sacrificial layers 129 such that the sacrificial layers 129 may form block units in the second direction Y. The second trenches T2 may separate the sacrificial layers 129 such that the sacrificial layers 129 may form cell array regions in the first direction X. The first and second trenches T1 and T2 may be connected to each other. The first trench T1 may be configured to extend from one side of the second trench T2 in the first direction X. The first and second trenches T1 and T2 may be formed on the first and second plate portions 101 and 102. The first and second trenches T1 and T2 may be configured to be partially recessed into upper portions of the first and second plate portions 101 and 102.

The trenches may further include a central trench Tm extending in the second direction Y. The central trench Tm may be formed in a region in which the third separation region 175 is formed. The central trench Tm may separate the sacrificial layers 129 such that the sacrificial layers 129 may form cell array regions in the first direction X. The central trench Tm may be formed on the third plate portion 103.

According to some example embodiments, the horizontal sacrificial layers between the first substrate 110 and the second horizontal conductive layer 109 may be removed through the trenches. As the horizontal sacrificial layers in contact with the channel structures CH1 and CH2 are removed, the gate dielectric layer 145 may be partially removed such that a portion of the side surface of the channel layer 140 may be exposed. A first horizontal conductive layer 108 may be formed in the region from which the horizontal sacrificial layers are removed. The first horizontal conductive layer 108 may be formed to be in contact with a portion of the side surface of the channel layer 140 as illustrated in FIG. 2C.

The sacrificial layers 129 may be selectively removed with respect to the interlayer insulating layers 120 by, for example, wet etching. Accordingly, a plurality of side openings LT may be formed between the interlayer insulating layers 120, and a portion of sidewalls of the gate dielectric layer 145 of the channel structures CH and the side surfaces of the interlayer insulating layer 120 may be exposed through the side openings LT. In this process, after the sacrificial layers 129 are removed, the stacked structure of the interlayer insulating layer 120 may be stably supported by the channel structures CH and the dummy channel structures DCH.

Figure 14A:
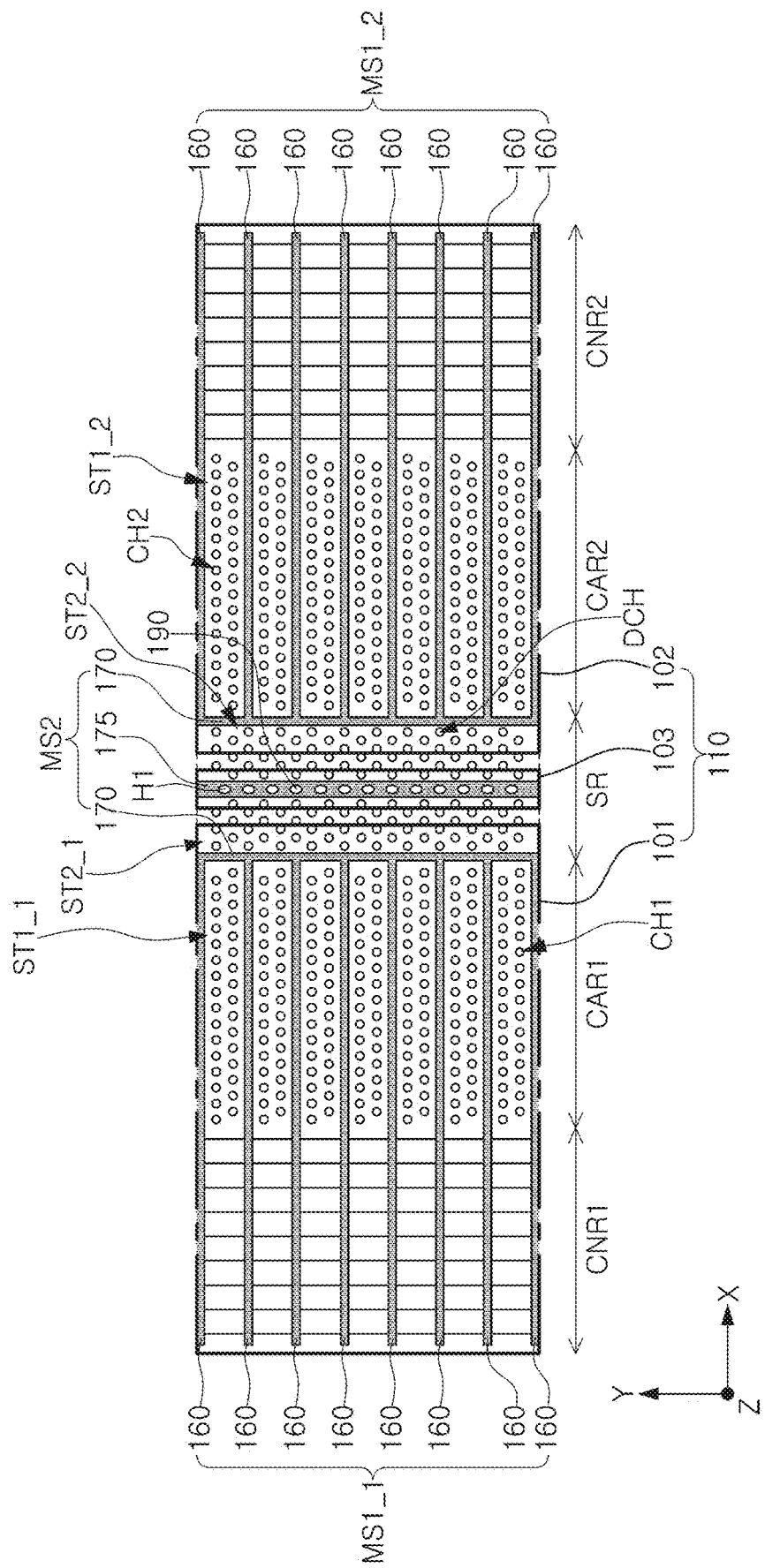
Figure 14B:
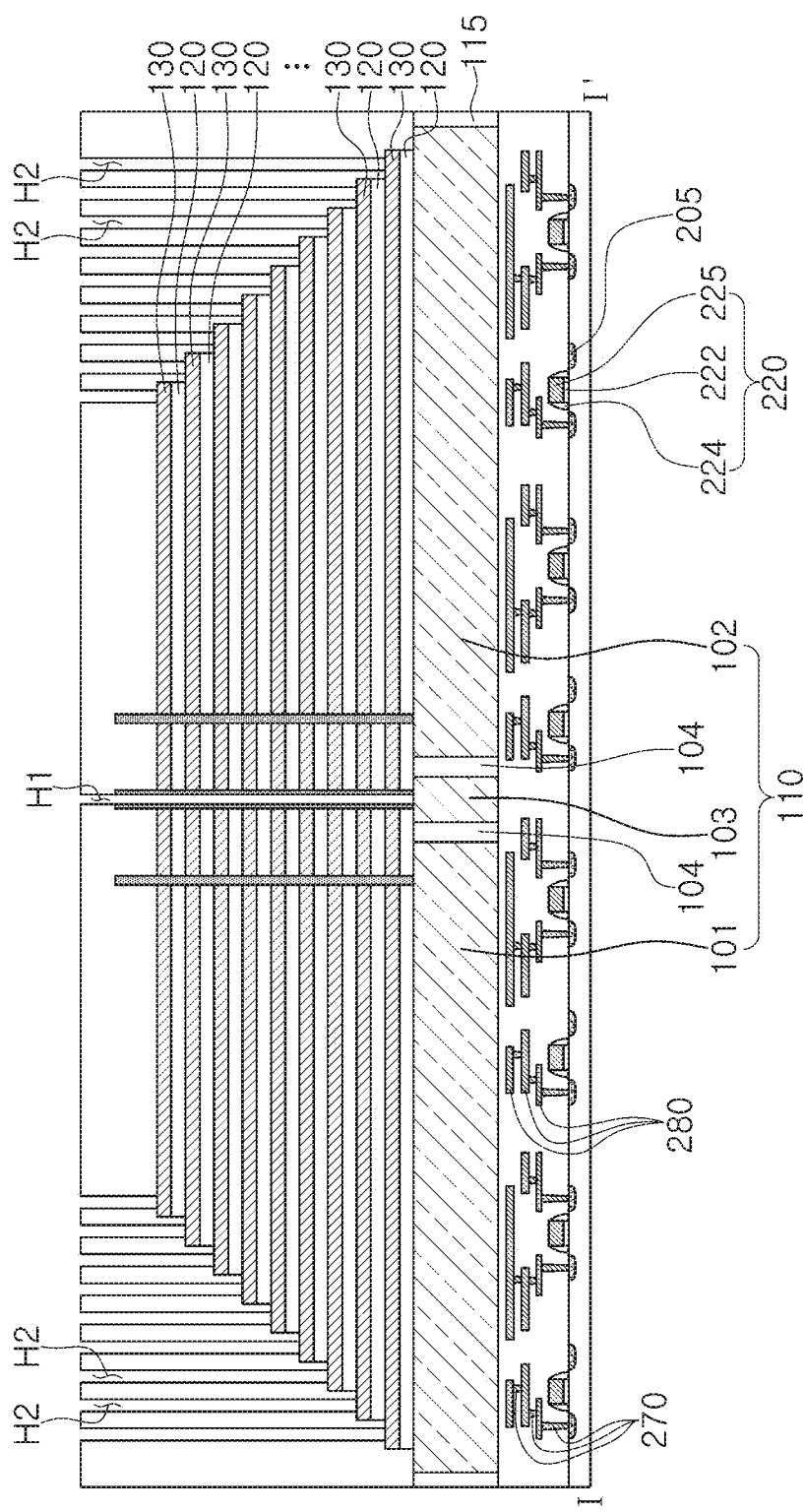

Referring to FIGS. 14A and 14B, the gate electrodes 130 may be formed in the side openings LT from which the sacrificial layers 129 are removed. Before the gate electrodes 130 are formed, a diffusion barrier 135 may be formed in the side openings LT. First and second block separation structures MS1_1 and MS1_2 and a cell array separation structure MS2 may be formed in the trenches. First holes H1 penetrating the third separation region 175 and exposing the third plate portion 103 may be formed.

The gate electrodes 130 may include at least one of metal, metal nitride, polycrystalline silicon, or a metal silicide material. The trenches may provide a transfer path of a material which is for forming the gate electrodes 130. After the gate electrodes 130 are formed, a material forming the gate electrodes 130 deposited in the trenches may be removed through an additional process.

A first separation region 160 may be formed in the first trench T1. A second separation region 170 may be formed in the second trench T2. A third separation region 175 may be formed in the central trench Tm. The first and second block separation structures MS1_1 and MS1_2 and the cell array separation structure MS2 may be formed in the same process and may have the same or substantially the same structure.

The first holes H1 may be configured to partially penetrate the capping insulating layer 180 and to penetrate the third separation region 175. The first holes H1 may expose a portion of the upper surface of the third plate portion 103.

According to some example embodiments, by forming an insulating spacer SP including an insulating material and a conductive layer CL including a conductive material in the trenches, the semiconductor device 100f in FIGS. 9A to 9C may be obtained. In this case, the process of forming the horizontal sacrificial layers and the first horizontal conductive layer 108 described with reference to FIGS. 13A and 13B may not be performed. The process of forming the channel structures CH1 and CH2 may further include forming the epitaxial layer 105 using a selective epitaxial growth (SEG) such as a heterogeneous or homogenous SEG.

In this process, the first holes H1 may be formed together with the second holes H2. The second holes H2 may penetrate the capping insulating layer 180 and may expose stepped ends of the gate electrodes 130, formed in a staircase shape, in the first and second staircase regions CNR1 and CNR2.

In some example embodiments, the first holes H1 may be formed in a process different from the process of forming the second holes H2. For example, the first holes H1 may be formed in a process of forming a through via in a separate through region penetrating the gate electrodes of the memory cell area and the peripheral circuit area.

Thereafter, upper wiring structures such as channel contact plugs and bit lines may be further formed on the channel structures CH.

Figure 15A:
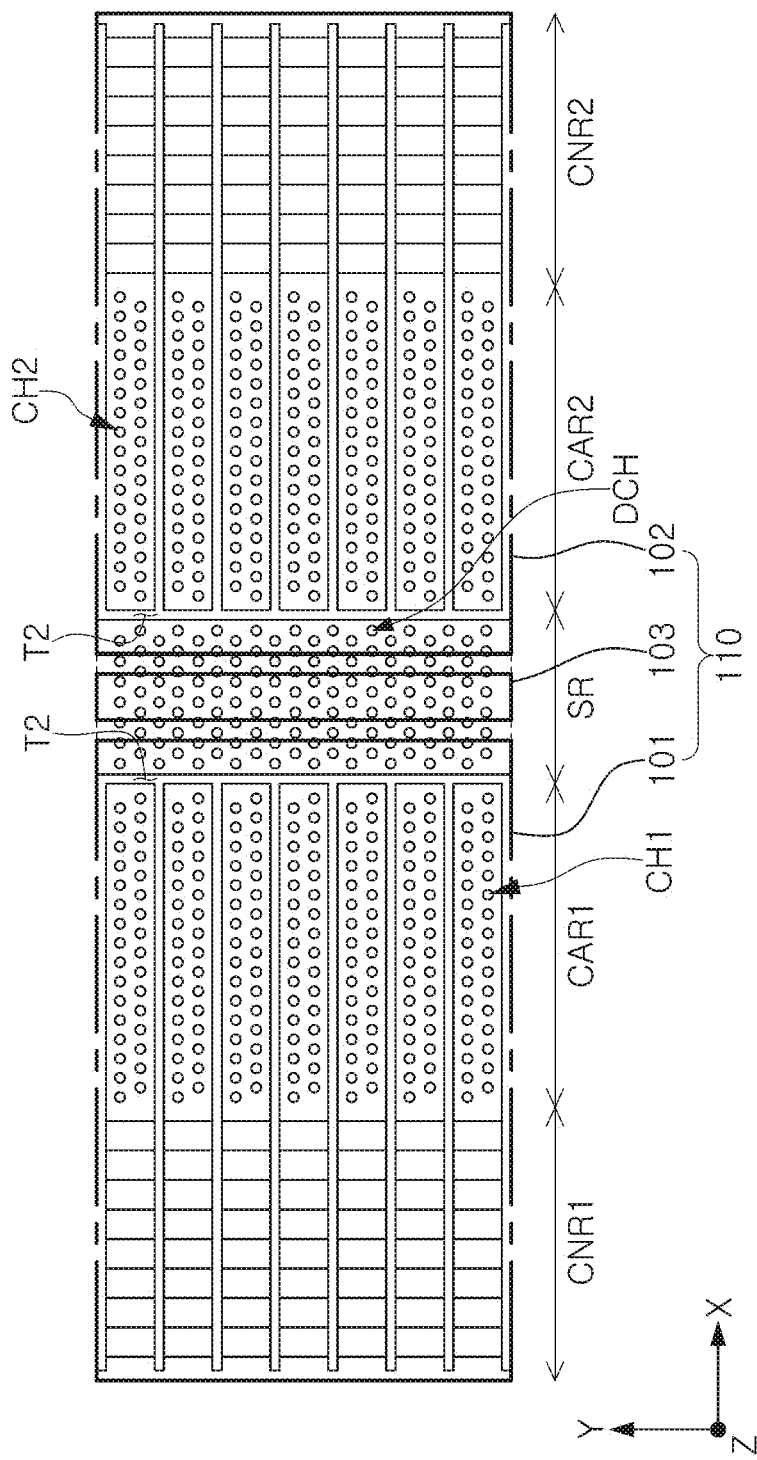
FIGS. 15A and 15B are schematic plan diagrams and cross-sectional diagrams illustrating a method of manufacturing a semiconductor device according to some example embodiments of inventive concepts.
Figure 15B:
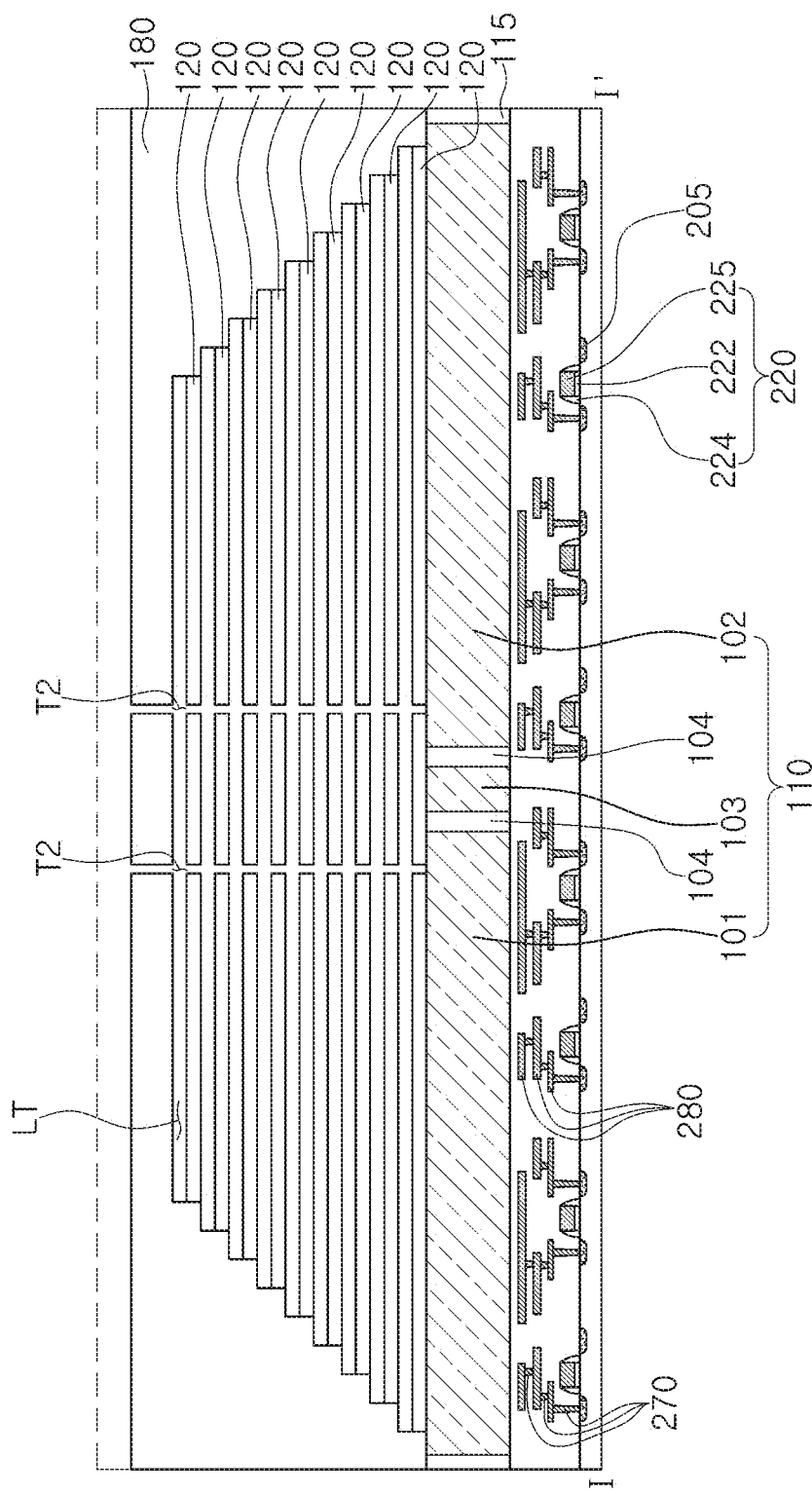

FIGS. 15A and 15B are schematic plan diagrams and cross-sectional diagrams illustrating a method of manufacturing a semiconductor device according to some example embodiments.

Referring to FIGS. 15A and 15B, channel structures CH1 and CH2 penetrating a preliminary stack structure PST may be formed. First and second trenches T1 and T2 penetrating the preliminary stack structure PST may be formed. The exposed sacrificial layers 129 may be removed through the first and second trenches T1 and T2.

Firstly, referring to FIGS. 11A to 12B, a first substrate 110 may be formed, sacrificial layers 129 and interlayer insulating layers 120 may be alternately stacked on the first substrate 110, and the sacrificial layers 129 and the interlayer insulating layers 120 may be partially removed such that that the sacrificial layers 129 may extend by different lengths in the first direction X.

Figure 13A:
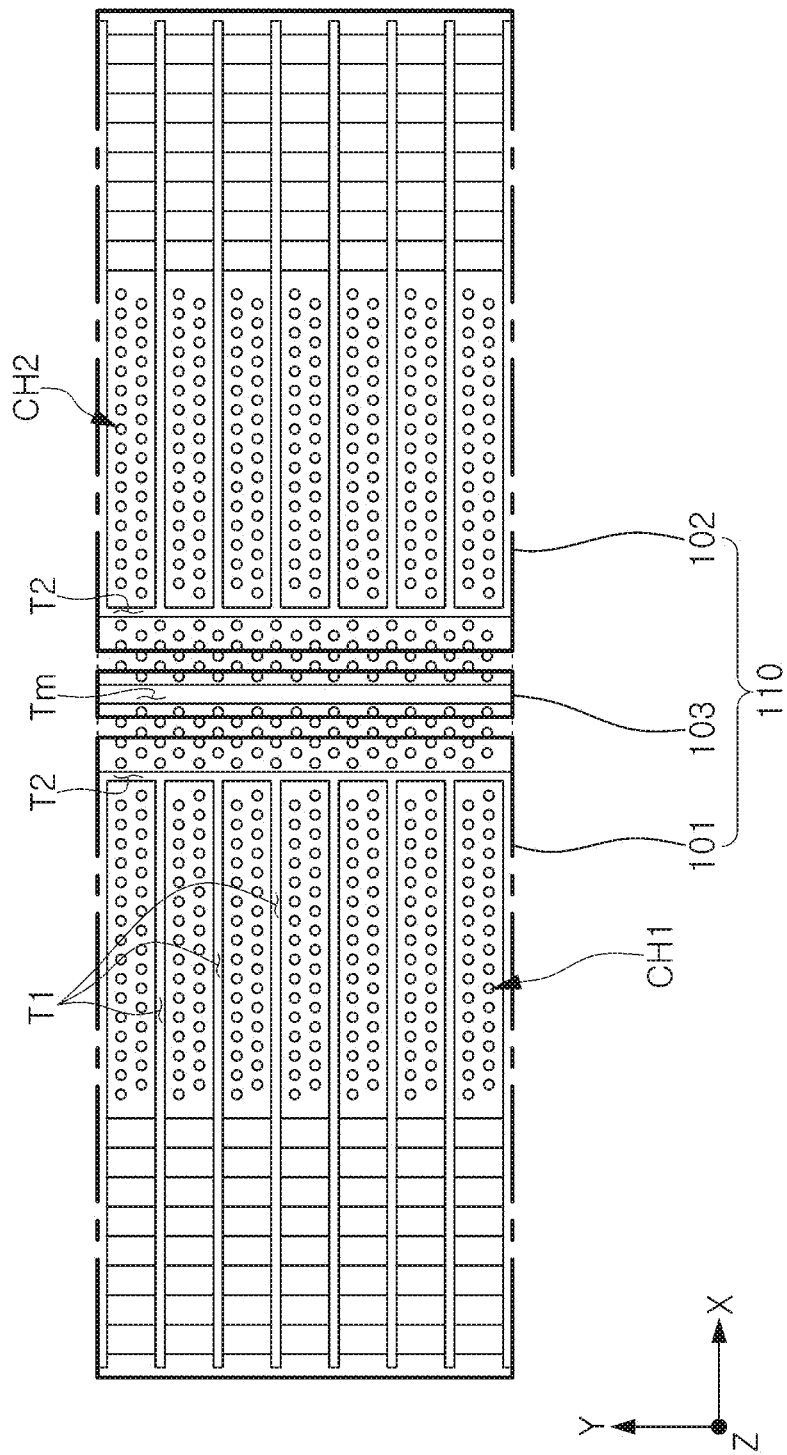
Figure 13B:
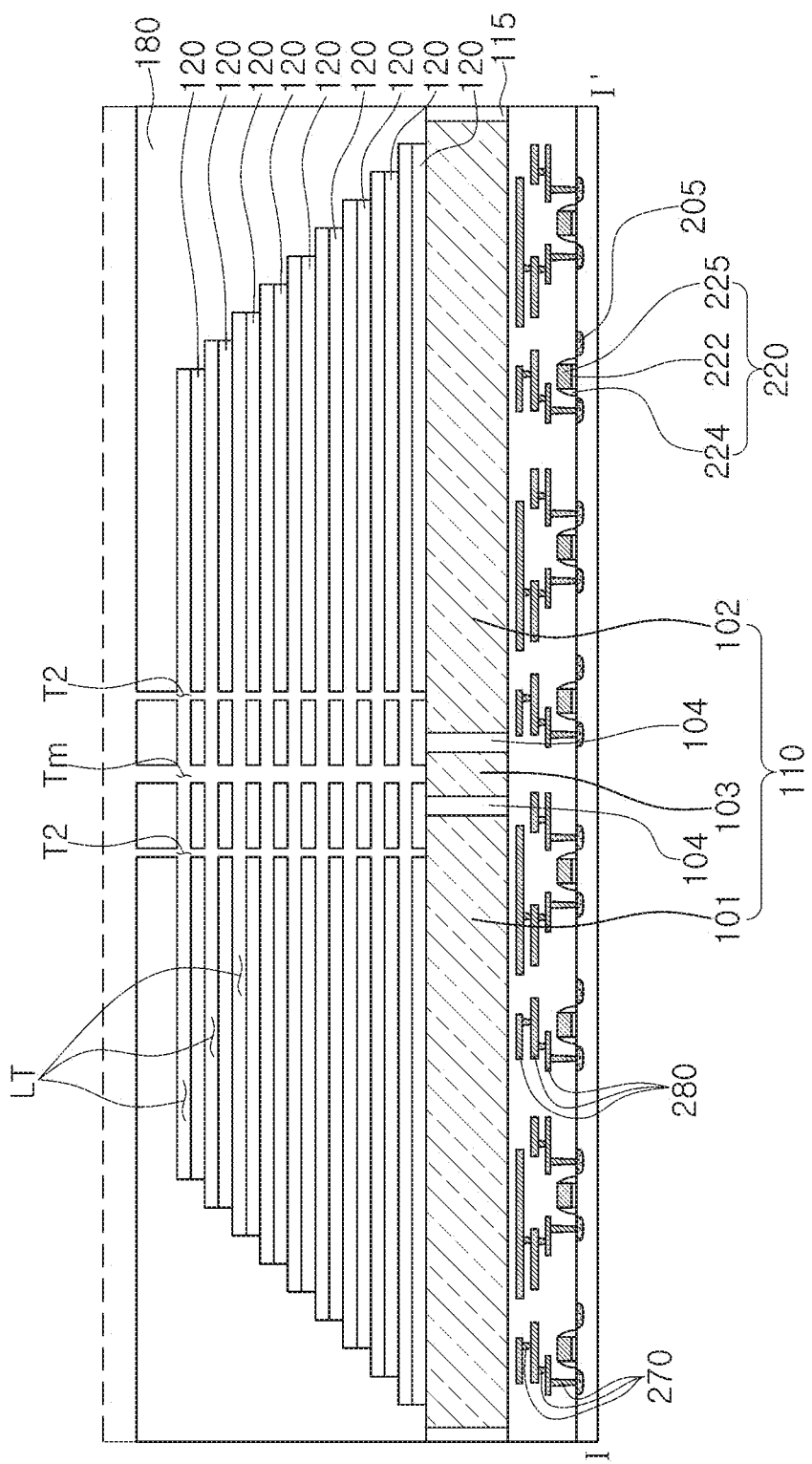

The channel structures CH1 and CH2 may be formed by the same method as described in the aforementioned example embodiment with reference to FIGS. 13A and 13B.

First and second trenches T1 and T2 may be formed in a region in which first and second block separation structures MS1_1 and MS1_2 and a cell array separation structure MS2 are formed by forming a mask layer using a photolithography process and anisotropically etching the preliminary stack structure PST. The first and second trenches T1 and T2 may be formed by the same method as described in the aforementioned some example embodiments with reference to FIGS. 13A and 13B. Thereafter, the gate electrodes 130, the first and second block separation structures MS1_1 and MS1_2 in the first and second trenches T1 and T2, and the cell array separation structure MS2 may be formed by the same method as described with reference to FIGS. 14A and 14B.

In this process, the central trench Tm (see FIGS. 13A and 13B) may not be formed. By only forming the first and second trenches T1 and T2, the semiconductor device 100a and 100b illustrated in FIGS. 4A to 5B may be obtained. As the center trench Tm is not formed, an area of the cell array separation region SR may be reduced.

In this process, by only forming a single second trench T2, the semiconductor device 100c illustrated in FIGS. 6A and 6B may be obtained. The first trenches T1 may extend in the first direction X to both sides of the single second trench T2.

In this process, as the central trench Tm is not formed, the sacrificial layers 129 may partially remain between a pair of the second trenches T2. The remaining sacrificial layers 129 may remain as central sacrificial layers 129m between the gate electrodes 130 such that the semiconductor device 100d illustrated in FIGS. 7A and 7B may be obtained.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with properties such as geometric shapes and/or levels, it is intended that precision of the geometric shape and/or level is not required but that latitude for the shape is within the scope of the disclosure. Further, regardless of whether numerical values or geometric properties are modified as "about" or "substantially," it will be understood that these values and shapes should be construed as including a manufacturing or operational tolerance (e.g., ±10%) around the stated numerical values or shapes.

By forming the separation structure in the first and second directions, an area of a separation region of the semiconductor device may be reduced such that a semiconductor device having improved integration density may be provided.

While the some example embodiments have been shown and described above, it will be apparent to those skilled in the art that modifications and variations could be made without departing from the scope of inventive concepts as defined by the appended claims.

What is claimed is:

1. A semiconductor device, comprising:
a first substrate including a first portion and a second portion spaced apart from the first portion, the first portion being a first polysilicon plate portion and the second portion being a second polysilicon plate portion;
a lower separation region including an insulating material between the first portion and the second portion;
a first stack structure on the first portion;
a second stack structure on the second portion and spaced apart from the first stack structure;
an intermediate stack structure between the first stack structure and the second stack structure, and spaced apart from the first and second stack structures;
first block separation structures penetrating through the first stack structure;
second block separation structures penetrating through the second stack structure; and
a contact plug penetrating through the intermediate stack structure,
wherein each of the first and second stack structures includes interlayer insulating layers and gate electrodes alternately stacked in a vertical direction,
wherein the intermediate stack structure includes first layers and second layers alternately stacked in the vertical direction,
wherein each of the first and second block separation structures extends in a first direction parallel to an upper surface of the first substrate,
wherein the contact plug does not vertically overlap with the first and second portions and is spaced apart from the first and second portions,
wherein lower surfaces of the first and second block separation structures are at a higher level than lower surfaces of the first and second portions where the first and second block separation structures contact the first and second portions, respectively,
wherein a material of the first layers is the same material as a material of the interlayer insulating layers, and
wherein an uppermost gate electrode of the gate electrodes is at a same level as an uppermost second layer of the second layers.

2. The semiconductor device of claim 1, further comprising:
a first intermediate separation structure between the contact plug and the first stack structure; and
a second intermediate separation structure between the contact plug and the second stack structure, wherein the uppermost gate electrode of the first stack structure contacts the first intermediate separation structure, and
wherein the uppermost gate electrode of the second stack structure contacts the second intermediate separation structure.

3. The semiconductor device of claim 1, further comprising:
a first intermediate separation structure between the contact plug and the first stack structure; and
a second intermediate separation structure between the intermediate stack structure and the second stack structure,
wherein the second layers include a material different from a material of the gate electrodes.

4. The semiconductor device of claim 3, wherein the contact plug penetrates through the first layers and the second layers of the intermediate stack structure.

5. The semiconductor device of claim 4, further comprising:
first channel structures penetrating through the first stack structure; and
second channel structures penetrating through the second stack structure,
wherein an upper surface of the contact plug is at a higher level than upper surfaces of the first and second channel structures,
wherein the first channel structures are connected to the first portion, and
wherein the second channel structures are connected to the second portion.

6. The semiconductor device of claim 1, wherein
the first substrate further includes a third portion between the first portion and the second portion,
the third portion is spaced apart from the first and second portions,
the third portion includes a polysilicon layer, and
the third portion is vertically overlapped by the intermediate stack structure.

7. The semiconductor device of claim 2, wherein
the first substrate further includes a third portion between the first portion and the second portion,
the third portion is spaced apart from the first and second portions,
the third portion includes a polysilicon layer, and
the third portion is vertically overlapped by the intermediate stack structure.

8. The semiconductor device of claim 4,
wherein the first substrate further includes a third portion between the first portion and the second portion,
wherein the third portion is spaced apart from the first portion and the second portion, and
the contact plug is connected to the third portion.

9. The semiconductor device of claim 1, further comprising:
a peripheral circuit region vertically overlapped by the first stack structure, the second stack structure, and the intermediate stack structure.

10. The semiconductor device of claim 9,
wherein the peripheral circuit region includes a base substrate and a circuit device including a transistor.

11. A semiconductor device, comprising:
a peripheral circuit region; and
a memory cell region vertically overlapping the peripheral circuit region,
wherein the memory cell region includes,
a first substrate including a first portion and a second portion spaced apart from the first portion, first stack structures on the first portion,
second stack structures on the second portion and spaced apart from the first stack structure, and
an intermediate stack structure between the first stack structure and the second stack structure, and spaced apart from the first and second stack structures,
first channel structures penetrating through the first stack structures,
second channel structures penetrating through the second stack structures, and
a contact plug penetrating through the intermediate stack structure, wherein each of the first and second portions include a polysilicon layer,
the contact plug does not vertically overlap with the first and second portions and is spaced apart from the first and second portions,
each of the first and second stack structures includes interlayer insulating layers and gate electrodes alternately stacked in a vertical direction,
the intermediate stack structure includes first layers and second layers alternately stacked in the vertical direction,
the contact plug penetrates through the first layers and the second layers of the intermediate stack structure,
a lower end of each of the first and second channel structures is at a higher level than lower surfaces of the first and second portions,
a material of the first layers is the same material as a material of the interlayer insulating layers,
an uppermost gate electrode of the gate electrodes is at a same level as an uppermost second layer of the second layers,
the first substrate further includes a third portion between the first portion and the second portion,
the third portion is spaced apart from the first and second portions,
the intermediate stack structure vertically overlaps the third portion, and
each of the first, second and third portions includes a polysilicon layer.

12. The semiconductor device of claim 11,
wherein each of the first and second stack structures extends in a first horizontal direction,
wherein the first stack structures are spaced apart from each other in a second horizontal direction perpendicular to the first horizontal direction,
wherein the second stack structures are spaced apart from each other in the second horizontal direction, and
wherein the intermediate stack structure extends in the horizontal second direction.

13. The semiconductor device of claim 11,
wherein the intermediate stack structure includes:
a first intermediate stack structure spaced apart from the first and second stack structures;
a second intermediate stack structure between the first intermediate stack structure and the first stack structures; and
a third intermediate stack structure between the first intermediate stack structure and the second stack structures,
wherein the first intermediate stack structure includes the first layers and the second layers,
wherein each of the second and third intermediate stack structures includes third layers and fourth layers alternately stacked in the vertical direction,
wherein the third layers extend from the first layers and include the same material as the material of the first insulating layers,
wherein a material of the second layers is different from a material of the fourth layers, and
wherein the material of the fourth layers is at the same as a material of the gate electrodes.

14. The semiconductor device of claim 11,
wherein the memory cell region is on the peripheral circuit region.

15. The semiconductor device of claim 11,
wherein the memory cell region is bonded to the peripheral circuit region.

16. A semiconductor device, comprising:
a peripheral circuit region; and
a memory cell region vertically overlapping the peripheral circuit region,
wherein the memory cell region includes,
a first substrate including a first portion and a second portion spaced apart from the first portion,
first stack structures on the first portion,
second stack structures on the second portion and spaced apart from the first stack structures,
an intermediate stack structure between the first stack structures and the second stack structures, and spaced apart from the first and second stack structures,
first channel structures penetrating through the first stack structures,
second channel structures penetrating through the second stack structures,
a first block separation structure between the first stack structures,
a second block separation structure between the second stack structures, and a contact plug penetrating through the intermediate stack structure,
wherein each of the first and second portions includes a polysilicon layer,
the contact plug does not vertically overlap with the first and second portions and is spaced apart from the first and second portions,
each of the first and second stack structures includes interlayer insulating layers and gate electrodes alternately stacked in a vertical direction,
the intermediate stack structure includes first layers and second layers alternately stacked in the vertical direction, and
the gate electrodes include a lowermost gate electrode, an uppermost gate electrode on the lowermost gate electrode, and intermediate gate electrodes between the lowermost gate electrode and the uppermost gate electrode,
wherein the first substrate further includes a third portion between the first portion and the second portion,
the third portion is spaced apart from the first and second portions,
the third portion includes a polysilicon layer, and
the third portion is vertically overlapped by the intermediate stack structure.

17. The semiconductor device of claim 16,
wherein each of the first and second stack structures extends in a first horizontal direction, and
wherein the intermediate stack structure extends in a second horizontal direction perpendicular to the first horizontal direction.

18. The semiconductor device of claim 16,
wherein a material of the first layers is the same material as a material of the interlayer insulating layers, wherein the second layers include a material different from a material of the gate electrodes, and wherein an uppermost second layer of the second layers is at a same level as the uppermost gate electrode.

* * * * *